United States Patent
Park et al.

(10) Patent No.: US 9,755,169 B2
(45) Date of Patent: Sep. 5, 2017

(54) NONVOLATILE MEMORY DEVICE

(75) Inventors: Jea Gun Park, Seongnam-Si (KR); Sung Ho Seo, Seoul (KR); Woo Sik Nam, Seoul (KR); Jong Sun Lee, Busan (KR)

(73) Assignee: IUCF-HYU (KR)

( * ) Notice: Subject to any disclaimer, the term of this patent is extended or adjusted under 35 U.S.C. 154(b) by 0 days.

(21) Appl. No.: 14/417,554

(22) PCT Filed: Jul. 27, 2012

(86) PCT No.: PCT/KR2012/006011
§ 371 (c)(1),
(2), (4) Date: Jan. 26, 2015

(87) PCT Pub. No.: WO2014/017683
PCT Pub. Date: Jan. 30, 2014

(65) Prior Publication Data
US 2015/0214497 A1    Jul. 30, 2015

(51) Int. Cl.
*H01L 51/05* (2006.01)
*B82Y 10/00* (2011.01)
*H01L 27/10* (2006.01)
*G11C 11/56* (2006.01)
*G11C 13/00* (2006.01)

(52) U.S. Cl.
CPC .......... *H01L 51/0591* (2013.01); *B82Y 10/00* (2013.01); *G11C 11/5664* (2013.01); *G11C 13/0014* (2013.01); *H01L 27/101* (2013.01); *G11C 2213/15* (2013.01)

(58) Field of Classification Search
None
See application file for complete search history.

(56) References Cited

U.S. PATENT DOCUMENTS

| | | | |
|---|---|---|---|
| 6,747,321 B2 | 6/2004 | Kanamori | |
| 7,482,621 B2 | 1/2009 | Yang et al. | |
| 2005/0274943 A1* | 12/2005 | Chen | 257/40 |
| 2005/0281082 A1* | 12/2005 | Miyawaki et al. | 365/174 |
| 2006/0131560 A1 | 6/2006 | Yang et al. | |

(Continued)

FOREIGN PATENT DOCUMENTS

| KR | 20080067857 | 7/2008 |
|---|---|---|
| KR | 20100123250 | 11/2010 |
| WO | 2010131901 A2 | 11/2010 |

OTHER PUBLICATIONS https://www.webelements.com/lithium/atom_sizes.html; 2017; and
https://www.webelements.com/fluorine/atom_sizes.html; 2017.*

(Continued)

*Primary Examiner* — Jesse Y Miyoshi
*Assistant Examiner* — Nilufa Rahim

(57) ABSTRACT

Provided is a nonvolatile memory device. The nonvolatile memory device includes: first and second electrodes spaced from each other; at least one nano crystal layer disposed between the first and second electrodes; and first and second material layers respectively disposed between the first and second electrodes and the nano crystal layer and having a bistable conductive property, wherein the first and second material layers are formed asymmetrical to each other.

14 Claims, 17 Drawing Sheets

(56) References Cited

U.S. PATENT DOCUMENTS

2007/0221986 A1 9/2007 Kang et al.
2009/0040805 A1* 2/2009 Park et al. .................. 365/111

OTHER PUBLICATIONS

Park, Jea-Gun et al., "Multilevel Nonvolatile Small-Molecule Memory Cell Embedded with Ni Nanocrystals Surrounded by a NiO Tunneling Barrier," Nano Letters, vol. 9, No. 4, 2009 American Chemical Society, Feb. 10, 2009, pp. 1713-1719.
Written Opinion for PCT/KR2012/006011, mailed Mar. 29, 2013.

* cited by examiner

[Fig. 1]
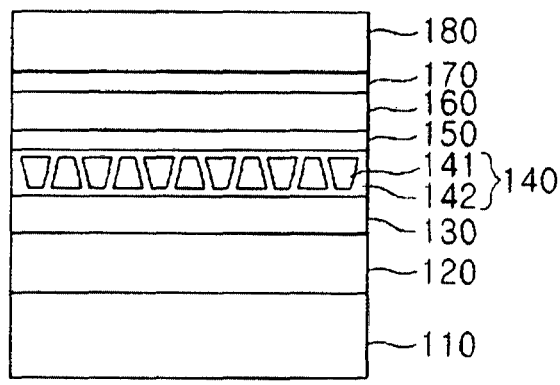
[Fig. 2]
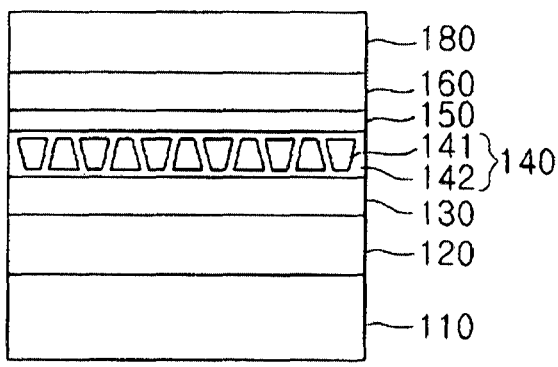
[Fig. 3]
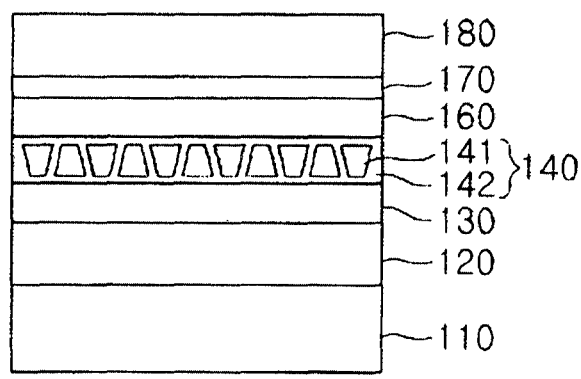

[Fig. 4]
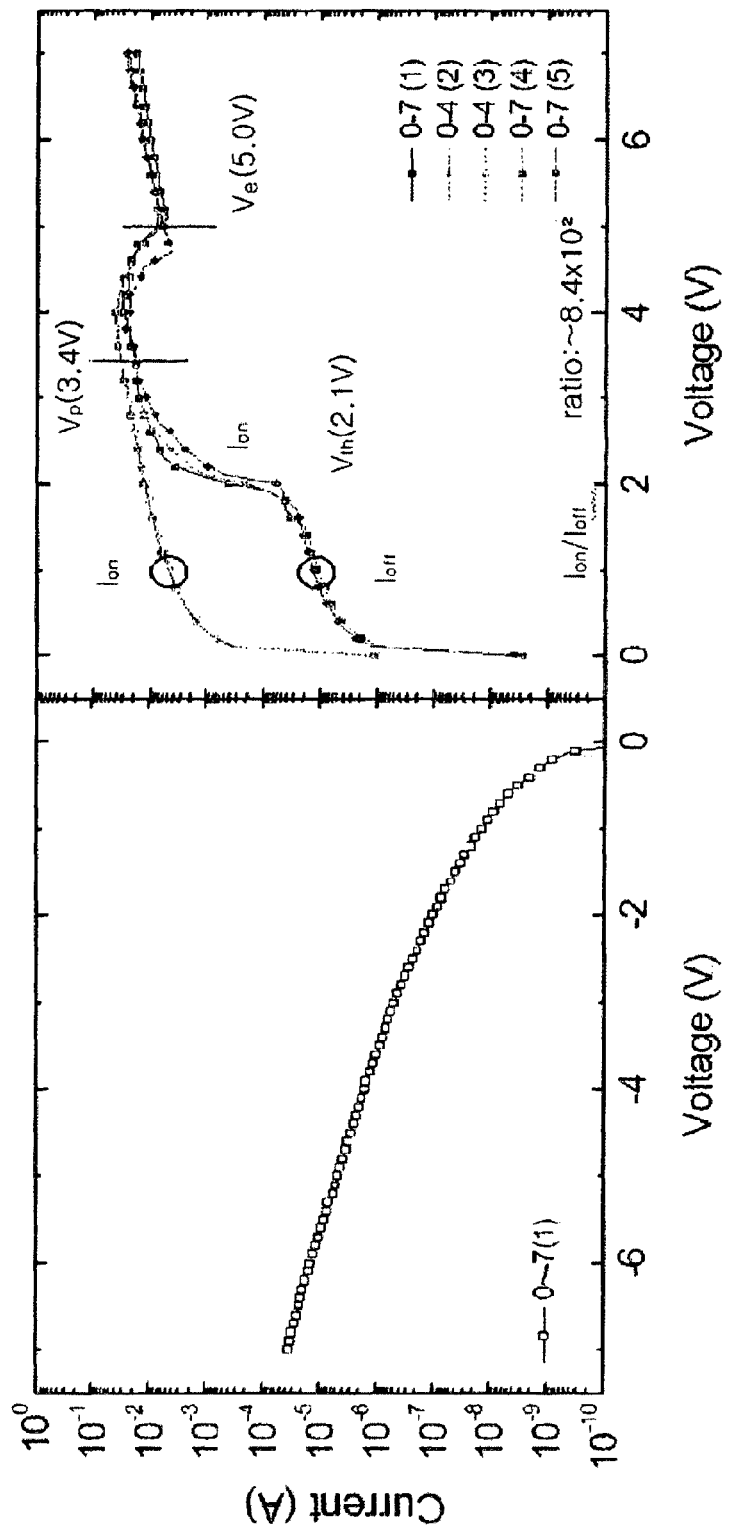

[Fig. 5]
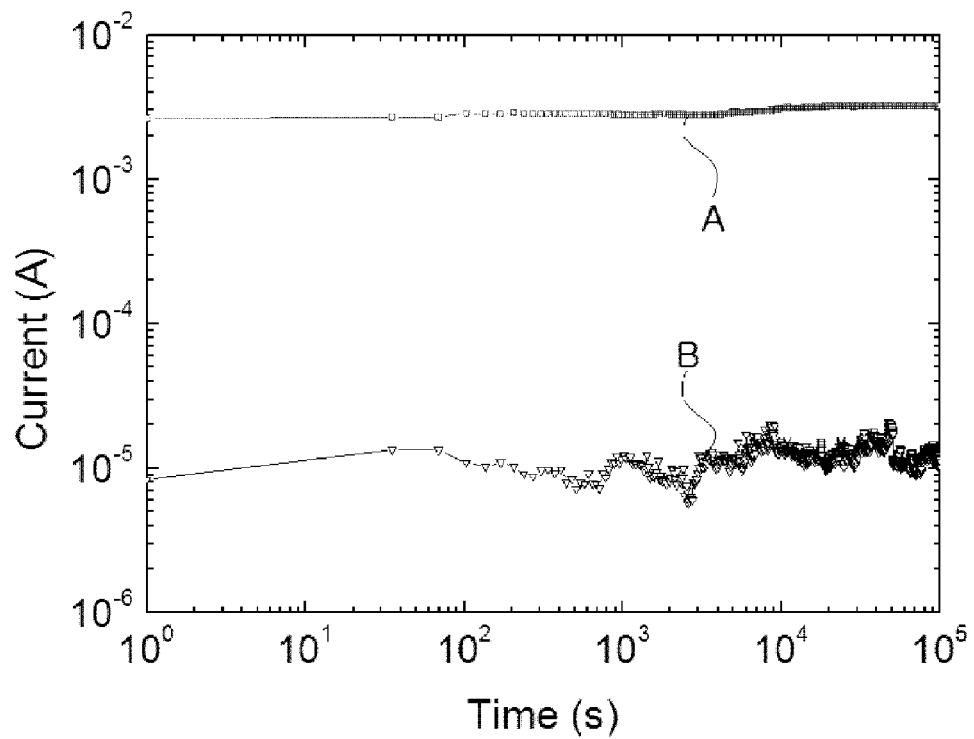
[Fig. 6]
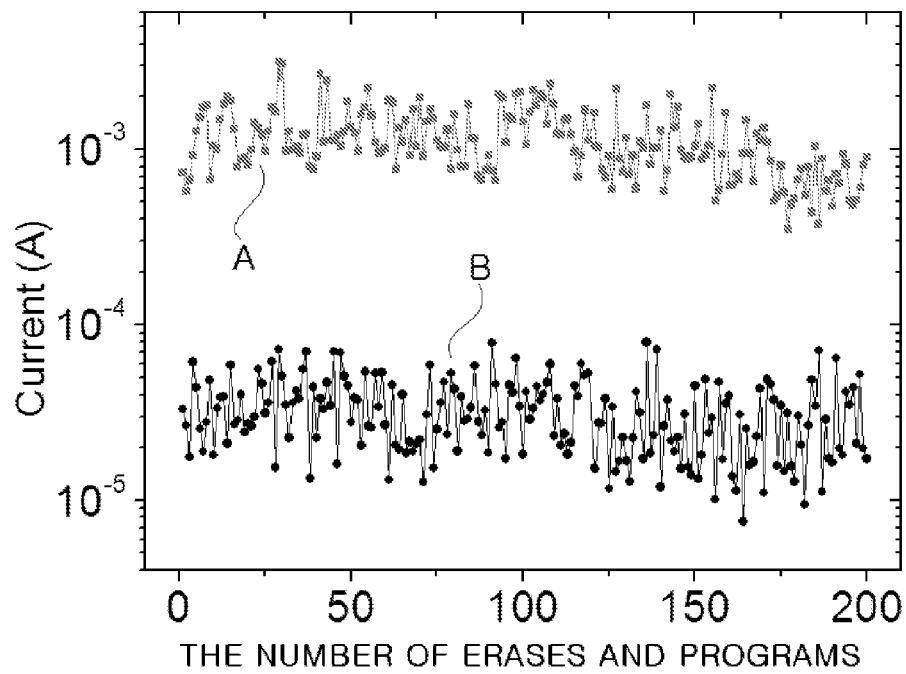

[Fig. 7]
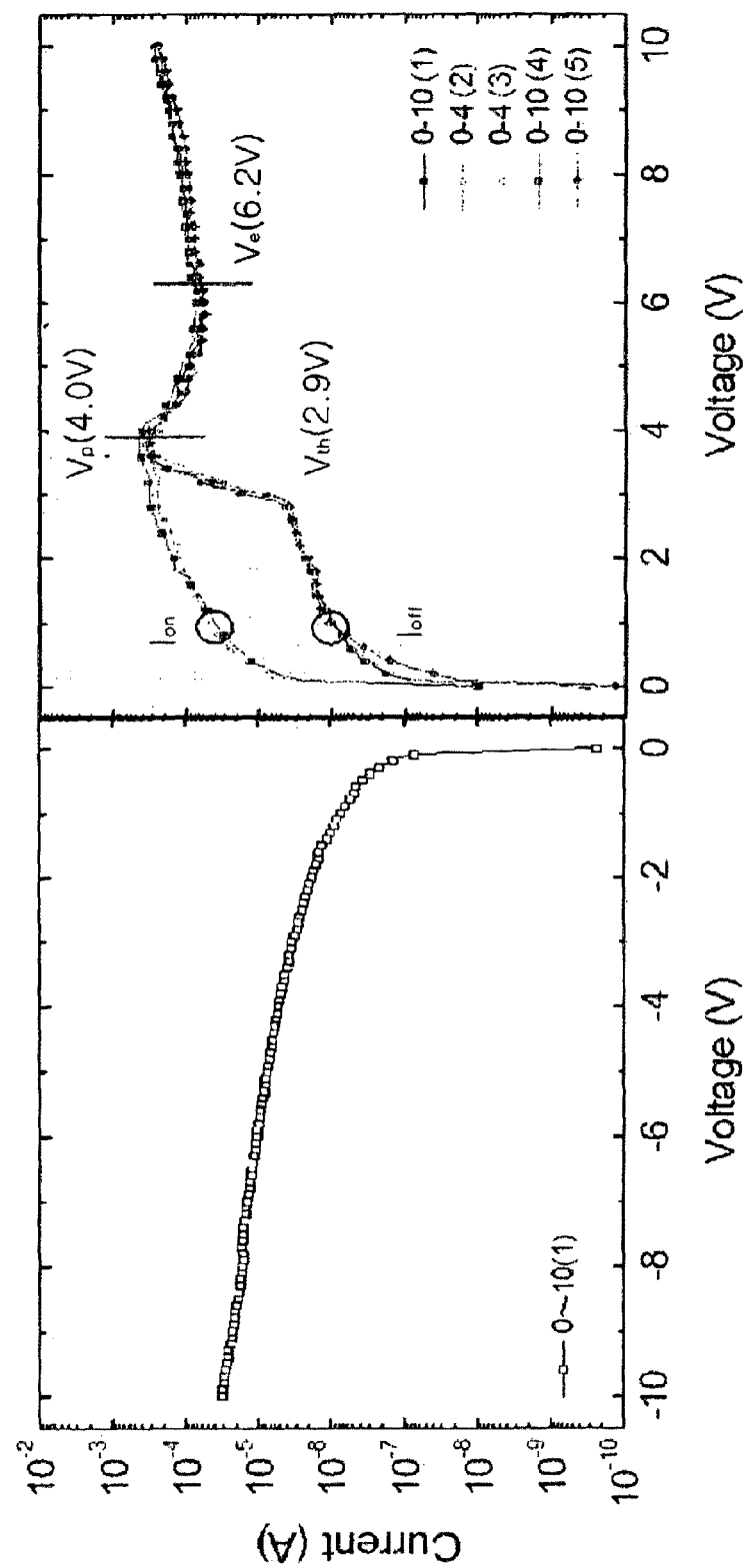

[Fig. 8]
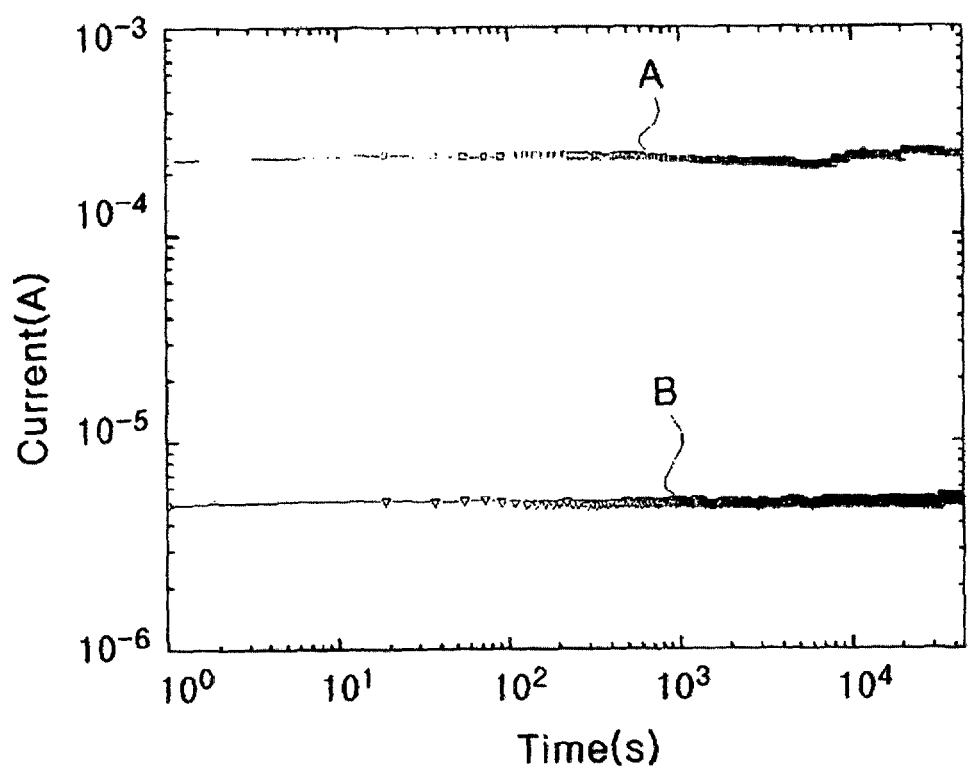

[Fig. 9]
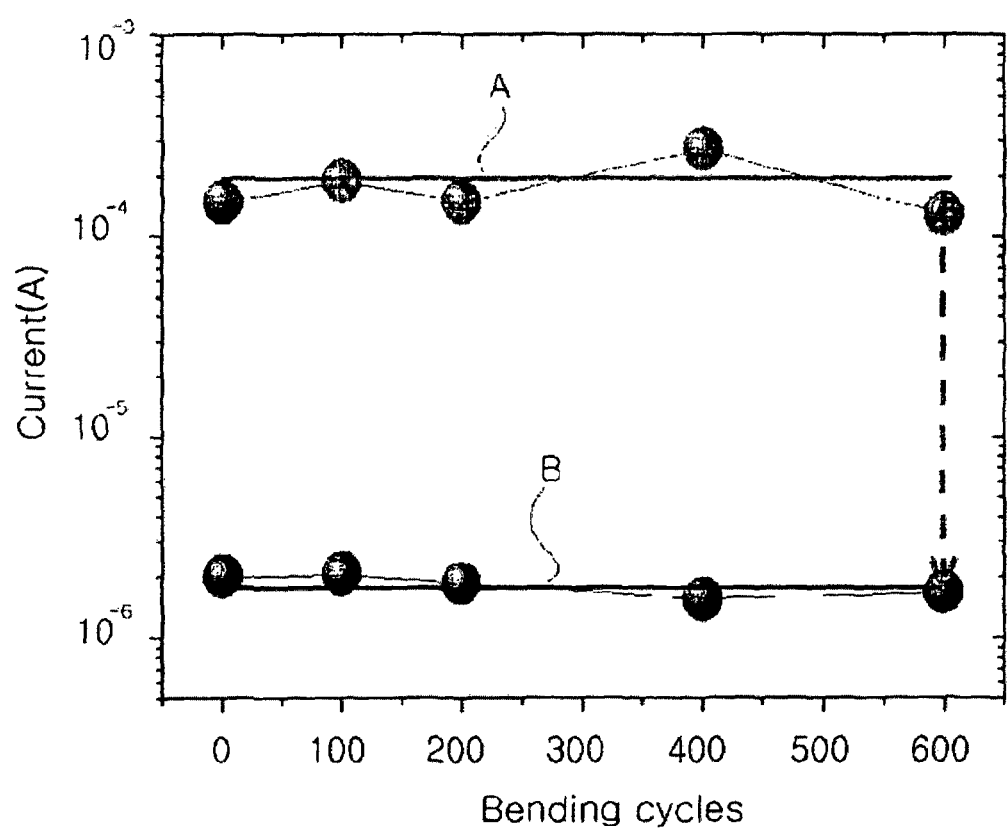

[Fig. 10]
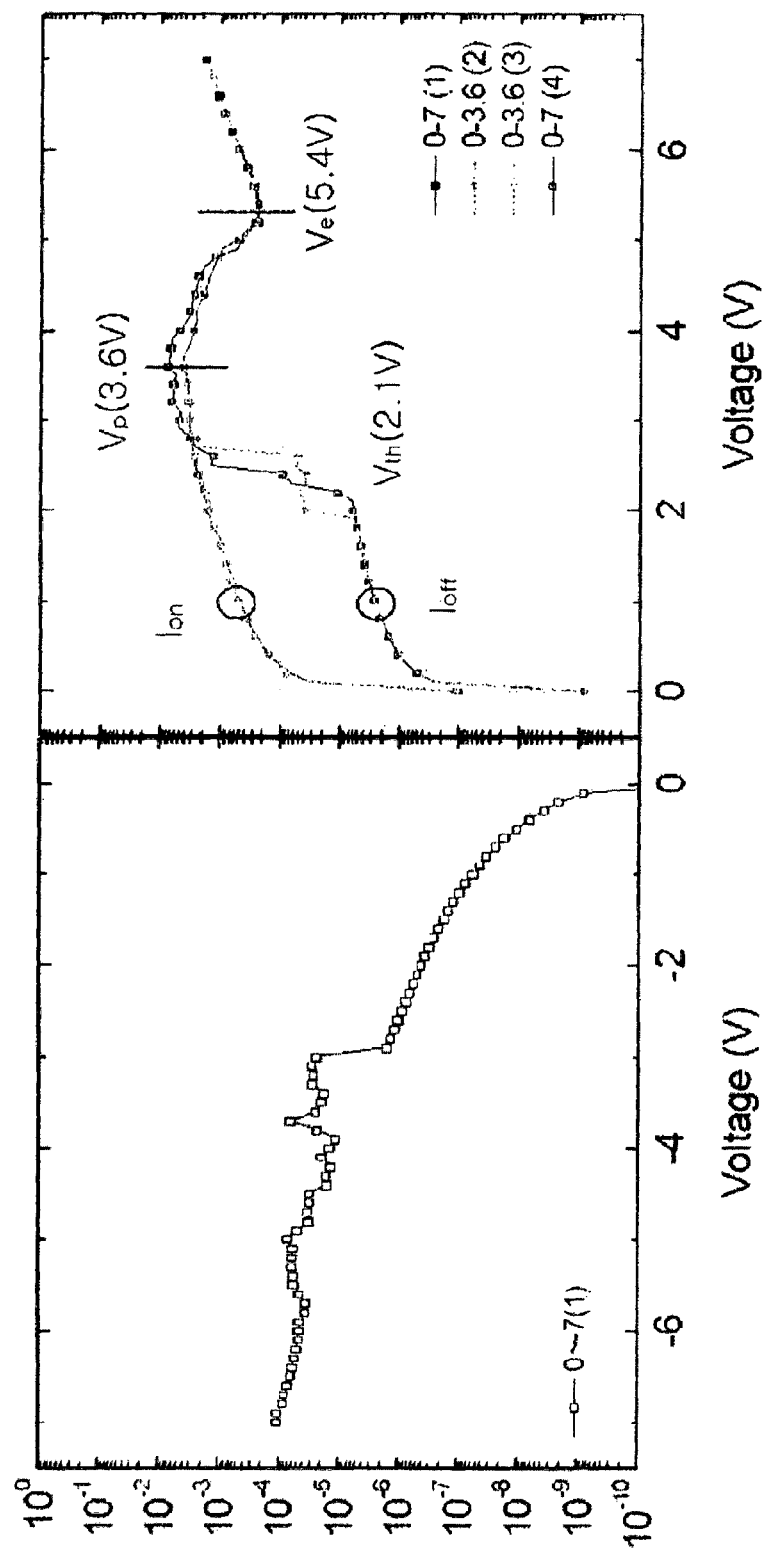

[Fig. 11]
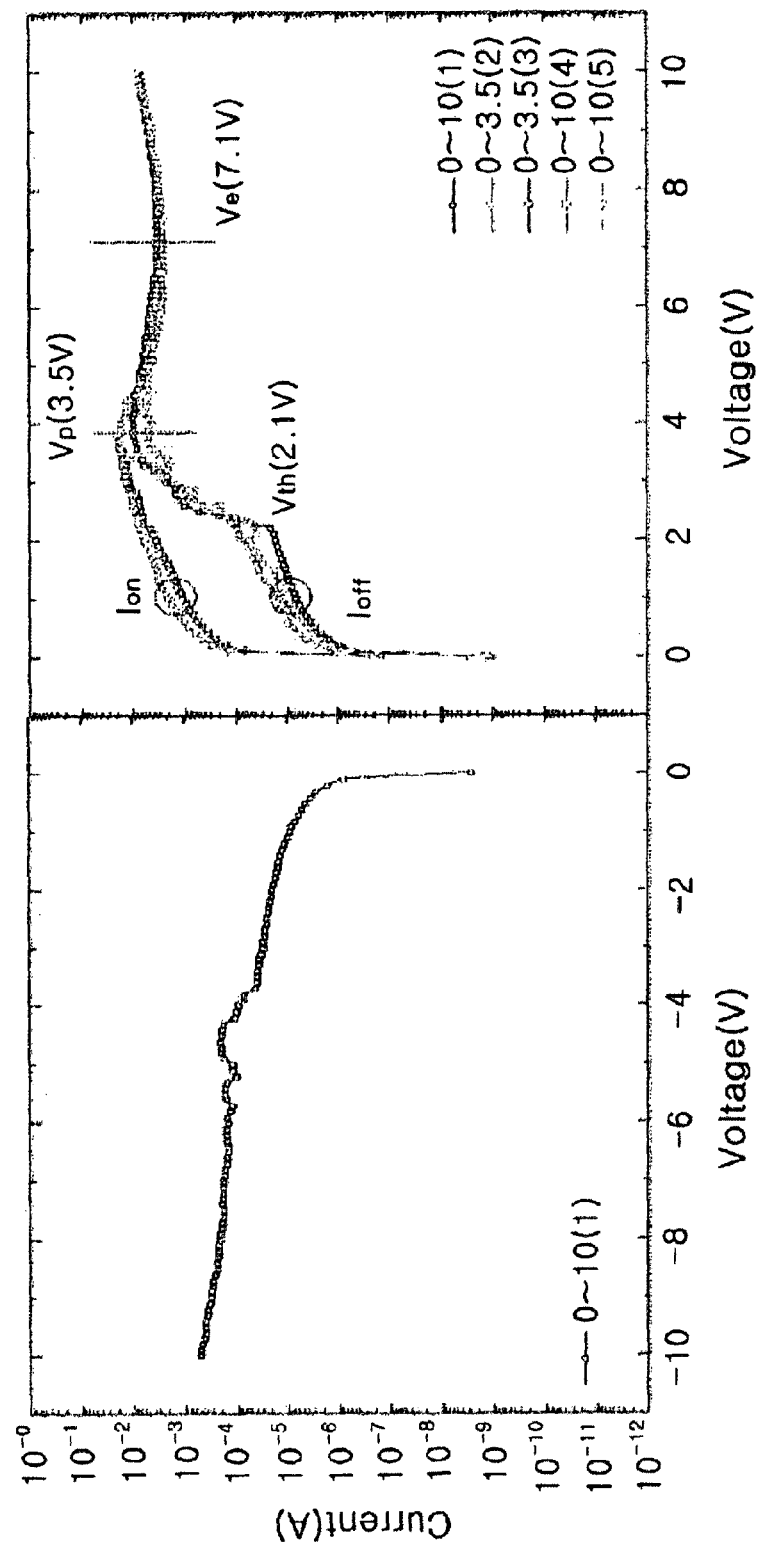

[Fig. 12]
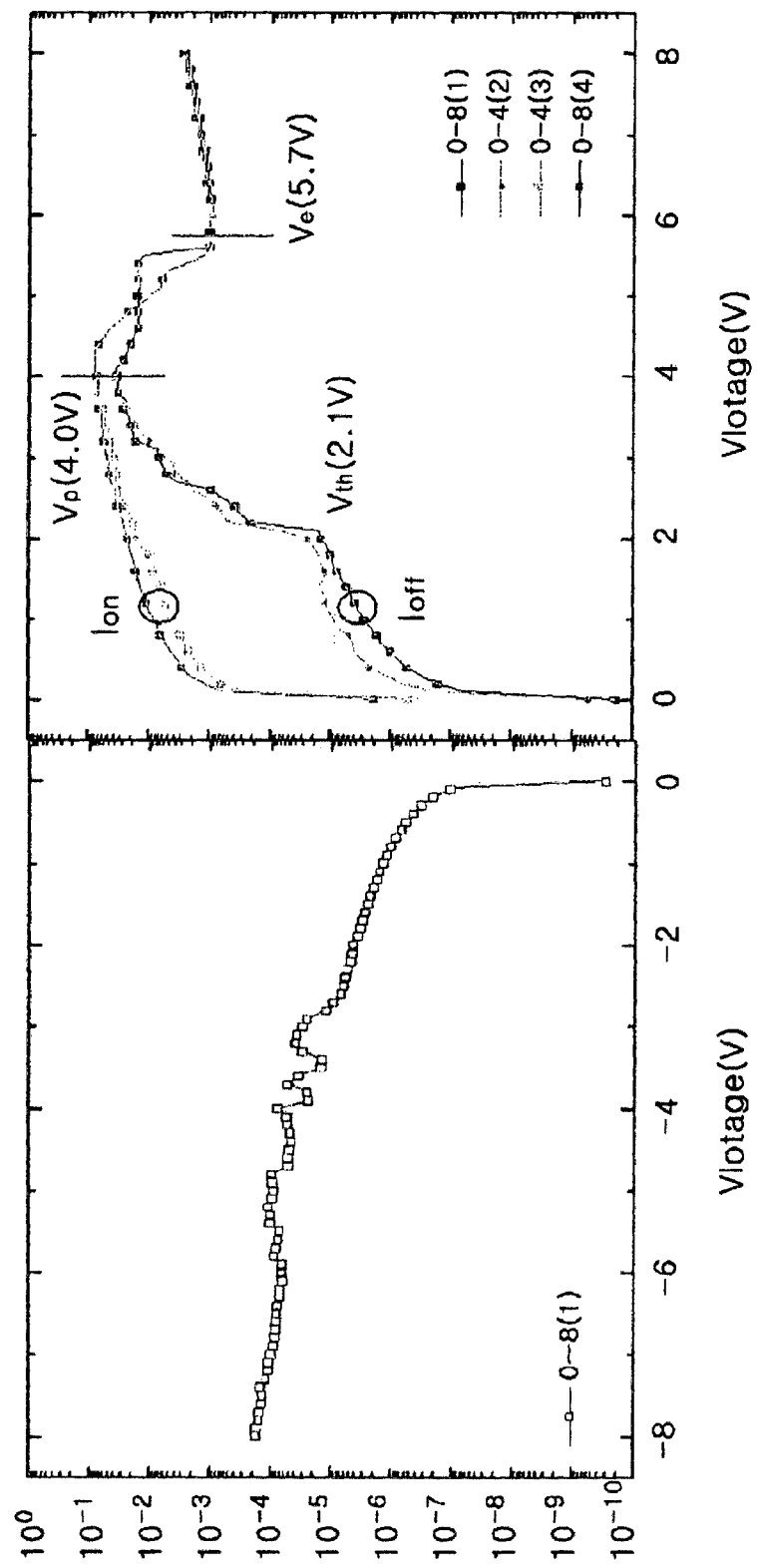

[Fig. 13]
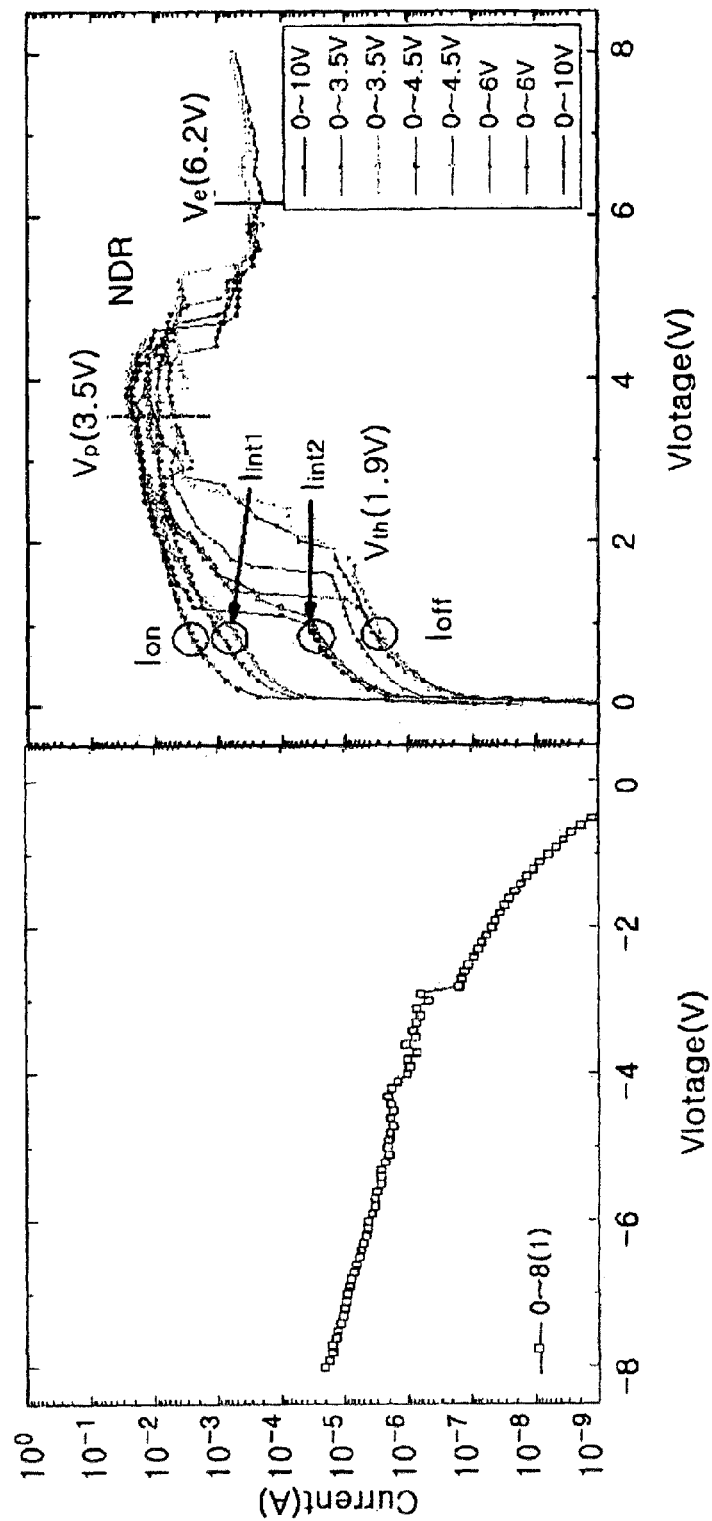

[Fig. 14]
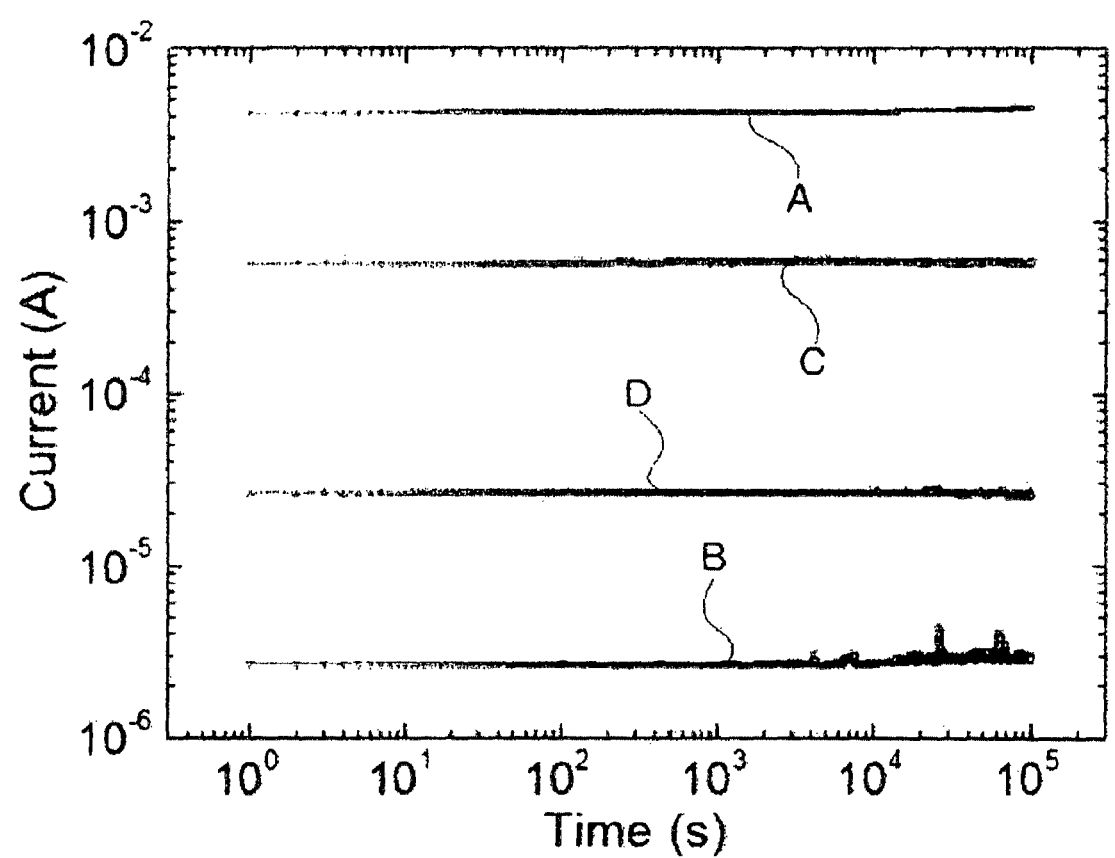

[Fig. 15]
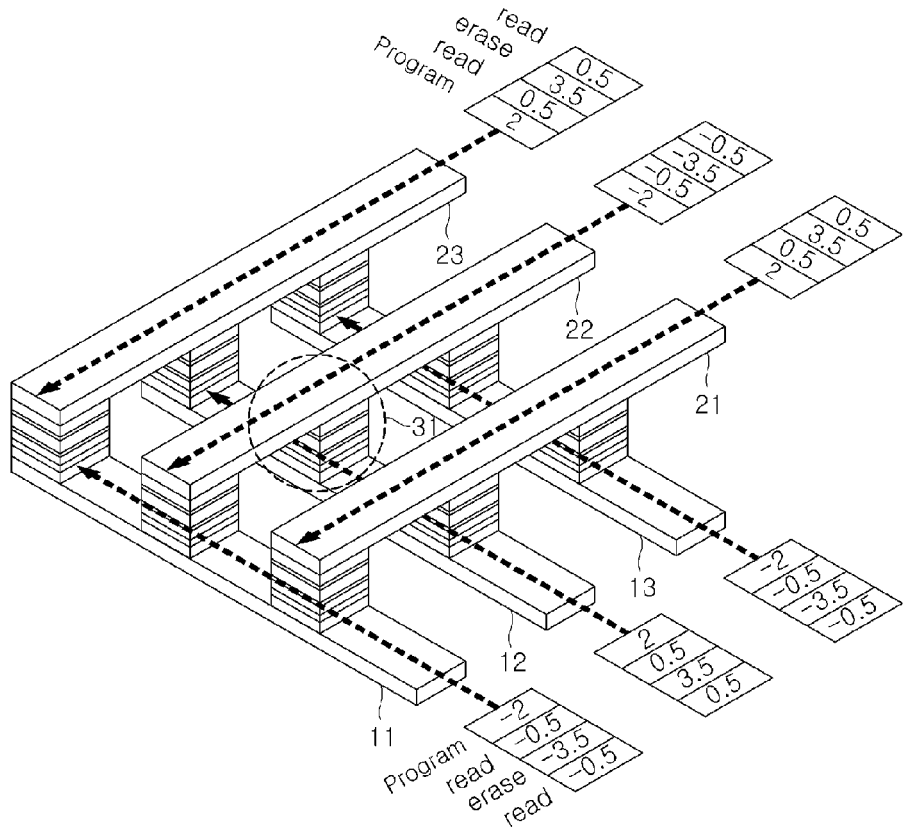
[Fig. 16]
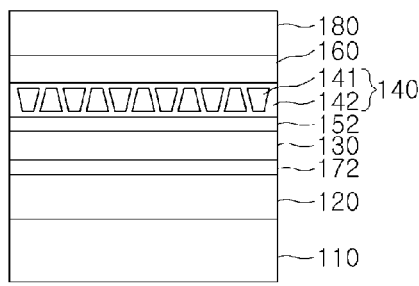
[Fig. 17]
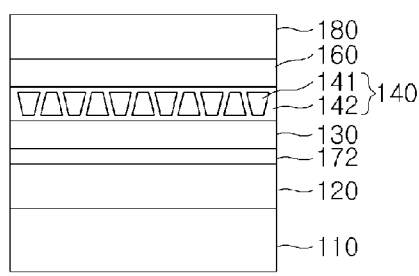

[Fig. 18]
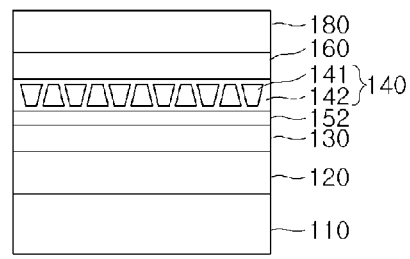
[Fig. 19]
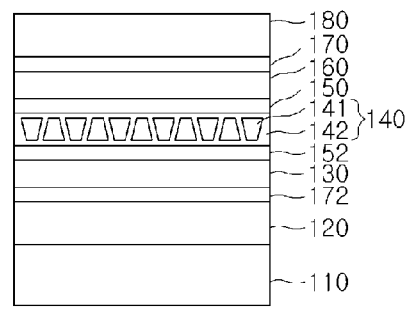
[Fig. 20]
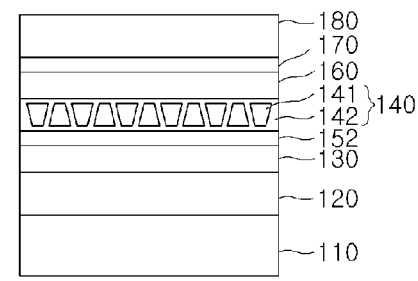
[Fig. 21]
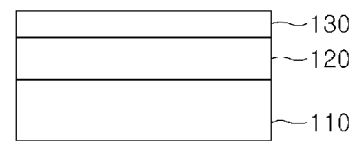
[Fig. 22]
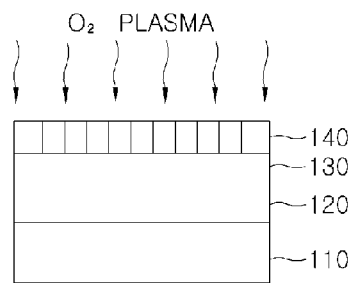

[Fig. 23]
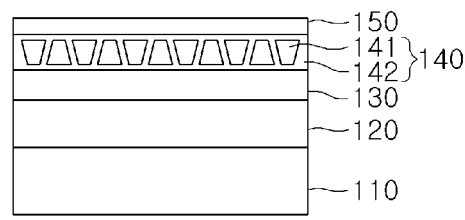
[Fig. 24]
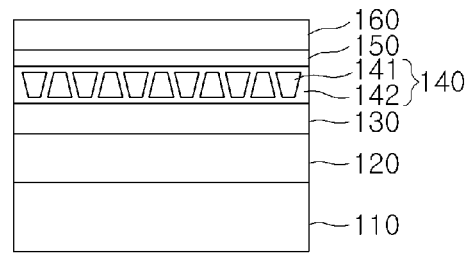
[Fig. 25]
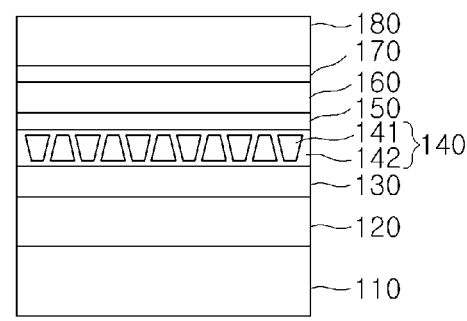

[Fig. 26]
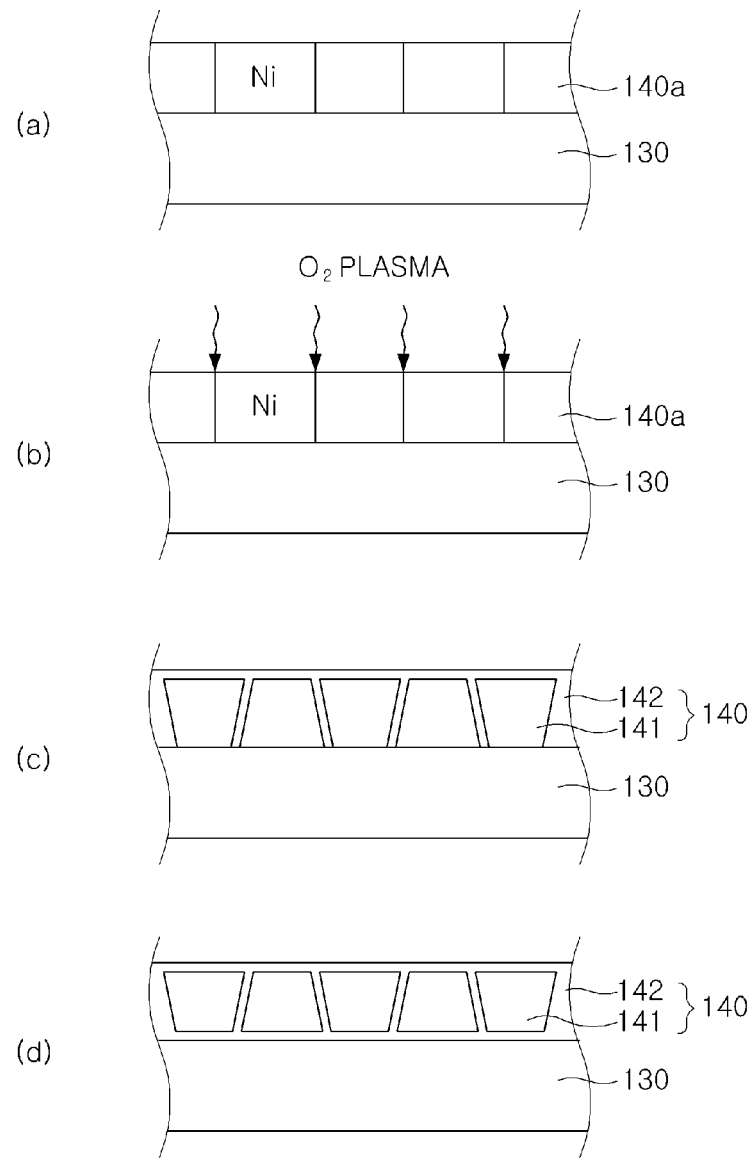

[Fig. 27]
(a) 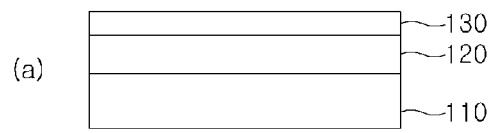
(b) 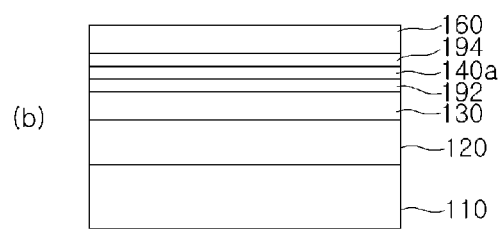
(c) 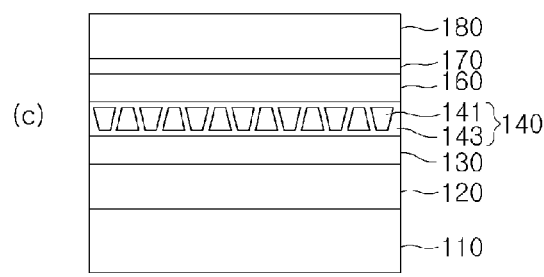
[Fig. 28]
(a) 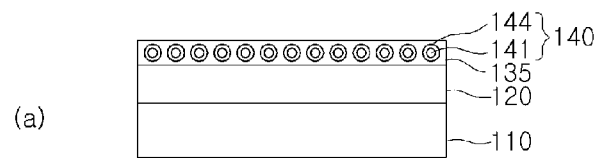
(b) 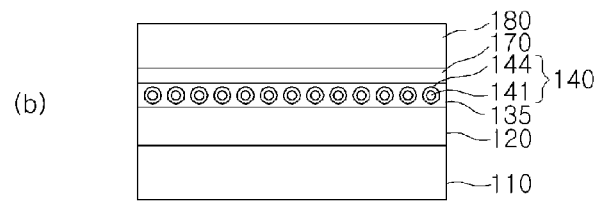

[Fig. 29]
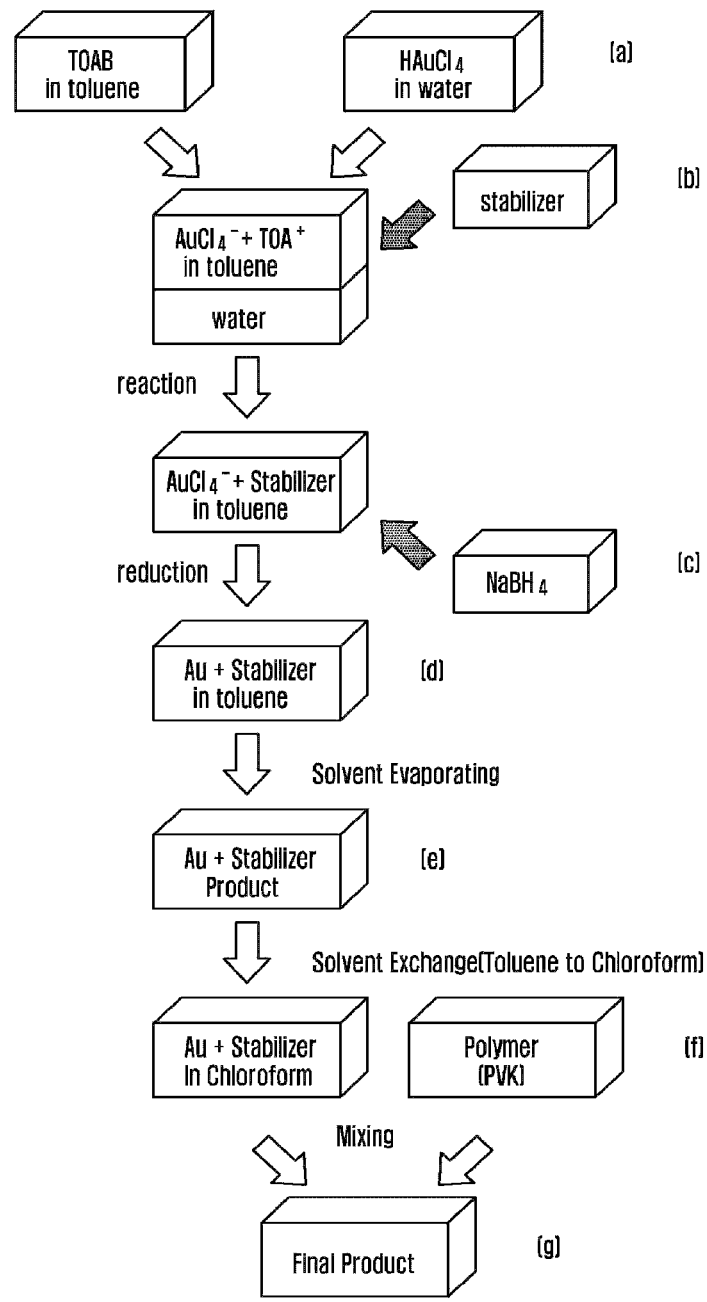

NONVOLATILE MEMORY DEVICE

TECHNICAL FIELD

The present disclosure relates to a nonvolatile memory device, and more particularly, to a nonvolatile memory device using organic material.

BACKGROUND ART

A memory device may be classified into a volatile memory and a nonvolatile memory device. Dynamic random access memory (DRAM) is typically used as the volatile memory device and flash memory is typically used as the nonvolatile memory device. The DRAM includes a transistor and a capacitor at one end thereof, and charges or discharges the capacitor in order to read its state. However, the DRAM continuously needs to recharge its capacitor. That is, if power is not applied, data in the DRAM disappear due to leakage current. Therefore, large power consumption is required to retain the data. Furthermore, the flash memory includes a stacked floating gate and control gate, and distinguishes data by measuring a threshold voltage after changing the amount of electrical charges in the floating gate through Fowler-Nordheim (F-N) tunneling according to a voltage applied to the control gate and a channel region. However, since the flash memory uses F-N tunneling, a voltage used for that is relatively very high. Also, since writing and reading data are performed in a predetermined order, data processing speed becomes slower.

In order to overcome the above limitations in the DRAM and the flash memory and implement the next generation memory device having their merits, many studies are in process. A lot of research on the next generation memory device is conducted in various directions according to materials that constitute a memory cell (i.e. a basic unit). That is, attempts on storing data on the basis of whether a material becomes in a low-resistance crystalline state or a high-resistance amorphous state after current is applied to a specific material, employing a material for a memory device after power is applied to the material through a ferroelectric property in order to have a spontaneous polarization property, or storing data by using a ferromagnetic material having properties of N and S poles through a magnetic field are being actively made. In addition, research on using a conductive organic material having two different conductive properties in order to form a memory device is also being actively conducted.

As a nonvolatile memory device using a conductive organic material has lower driving voltage and a more excellent bistable property, it is evaluated as a more excellent device. Moreover, as data retention time becomes longer, and less property change occurs according to repeatedly programming and erasing data, it is evaluated as a more excellent device. Therefore, research is underway to implement a nonvolatile memory by using an organic material having the above characteristics.

Moreover, U.S. Pat. No. 6,747,321 suggests a memory device where a special layer that serves as Schottky diode is inserted between a memory layer and an electrode layer. That is, U.S. Pat. No. 6,747,321 has a structure in which a memory layer and a selection device using Schottky diode are stacked. However, in relation to a memory device having a selection device, properties of the memory device are changed according to properties of the selection device, and accordingly, characteristics such as read voltage margin or memory margin are deteriorated. Additionally, U.S. Pat. No. 7,482,621 suggests an organic memory device where an organic layer is formed between an Indium Tin Oxide (ITO) electrode and a copper electrode, and also, a LiF buffer layer is formed between the organic layer and the copper electrode. Here, the LiF buffer layer serves as a metal ion barrier or a copper ion barrier to the copper electrode according to a voltage applied to the two electrodes.

DISCLOSURE

Technical Problem

The present disclosure provides a nonvolatile memory device without a selection device.

The present disclosure also provides a nonvolatile memory device having a bistable property at a low driving voltage through a structure change.

The present disclosure also provides a nonvolatile memory device including a buffer layer that facilitates charge transfer when forward bias is applied and suppresses charge transfer when reverse bias is applied.

Technical Solution

In accordance with an exemplary embodiment, a nonvolatile memory device includes: first and second electrodes spaced from each other; at least one nano crystal layer disposed between the first and second electrodes; and first and second material layers respectively disposed between the first electrode and the nano crystal layer and between the second electrode and the nano crystal layer and having a bistable conductive property, wherein the first and second material layers are formed asymmetrical to each other.

The nano crystal layer may include a plurality of nano crystals and a barrier layer surrounding the plurality of nano crystals.

The first material layer may include at least one conductive organic layer, and the second material layer may include at least one conductive organic layer and at least one buffer layer.

The conductive organic layers may have different thicknesses.

At least one of the conductive organic layers may include a low molecular weight material having a charge transfer characteristic.

At least one of the conductive organic layers may be formed of at least one of $Alq_3$, AlDCN, α-NPD, PtOEP, TPD, ZnPc, CuPc, C60, PBD, CBP, Pentacene, Balq, and PCBM.

The second material layer may include at least one of a first buffer layer between the nano crystal layer and the conductive organic layer of the second material layer and a second buffer layer between the conductive organic layer of the second material layer and the second electrode.

The first and second buffer layers may include a metallic compound of a metal having a small work function.

The first buffer layer or the second buffer layer may include a metallic compound of an alkali metal or an alkaline earth metal.

The first buffer layer or the second buffer layer may be formed of at least one of LiF, NaCl, CsF, $Li_2O$, BaO, and Liq.

The first buffer layer may have a different thickness than the second buffer layer.

The buffer layer may facilitate charge transfer in forward bias when a high voltage and a low voltage are respectively applied to the first and second electrodes and may suppress charge transfer in a forward bias when a low voltage and a high voltage are respectively applied to the first and second electrodes.

The nonvolatile memory device may further include a threshold voltage region where the amount of a current is drastically increased according to a potential difference applied between the first electrode and the second electrode and a negative differential resistance region where a current is decreased as a potential difference applied between the first and second electrodes is increased.

A read operation may be performed at a first voltage level of less than a threshold voltage; a program operation may be performed at a second voltage level of the threshold voltage to the negative differential resistance region; and an erase operation may be performed at a third voltage level greater than the second voltage level.

The nonvolatile memory device may be programmed with a multi level according to the second voltage level.

In accordance with another exemplary embodiment, a nonvolatile memory device includes: first and second electrodes spaced from each other; at least one nano crystal layer disposed between the first and second electrodes; first and second conductive organic layers respectively disposed between the first electrode and the nano crystal layer and between the second electrode and the nano crystal layer and having a bistable conductive property; and at least one buffer layer disposed between the first and second electrodes, wherein the buffer layer facilitates charge transfer in forward bias when a high voltage and a low voltage are respectively applied to the first and second electrodes and suppresses charge transfer in a forward bias when a low voltage and a high voltage are respectively applied to the first and second electrodes.

The nano crystal layer may include a plurality of nano crystals and a barrier layer surrounding the plurality of nano crystals.

The first and second conductive organic layers may be formed of a low molecular weight material having a charge transfer characteristic.

The first and second conductive organic layers may be formed of at least one of $Alq_3$, AlDCN, α-NPD, PtOEP, TPD, ZnPc, CuPc, C60, PBD, CBP, Pentacene, Balq, and PCBM.

The second conductive organic layer may be thicker than the first conductive organic layer.

The buffer layer may be prepared between the first or second electrode and the first or second organic layer or between the first or second conductive organic layer and the nano crystal layer.

The buffer layer may include a metallic compound of an alkali metal or an alkaline earth metal.

The buffer layers may include a metallic compound of a metal having a small work function.

The buffer layers may include at least one of LiF, NaCl, CsF, $Li_2O$, BaO, and Liq.

Advantageous Effects

A memory device according to embodiments may perform a rectifying operation as a memory cell itself, so that a memory cell for performing a selection function according to potential difference may be implemented without an additional selection device such as a diode.

Moreover, a program state and an erase state are maintained clearly at low operating voltage, a ratio Ion/Ioff of on-current Ion to off-current Ioff is large, and there is no property change according to repeated programs and erases. Therefore, an excellent nonvolatile memory may be implemented.

Moreover, since no selection device is required, a memory device having a simple structure may be implemented and may be easily applicable to a three-dimensional structure.

DESCRIPTION OF DRAWINGS

FIG. 1 is a sectional view of a nonvolatile memory device in accordance with an exemplary embodiment.

FIGS. 2 and 3 are sectional views of a nonvolatile memory device in accordance with other exemplary embodiments.

FIGS. 4 to 6 are characteristic graphs of a nonvolatile memory device in accordance with an experiment 1.

FIGS. 7 to 9 are characteristic graphs of a nonvolatile memory device on a flexible substrate in accordance with an experiment 2.

FIG. 10 is a current-voltage characteristic graph of a nonvolatile memory device in accordance with an experiment 3.

FIG. 11 is a current-voltage characteristic graph of a nonvolatile memory device in accordance with an experiment 4.

FIG. 12 is a current-voltage characteristic graph of a nonvolatile memory device in accordance with an experiment 5.

FIGS. 13 and 14 are characteristic graphs of a nonvolatile memory device in accordance with an experiment 6.

FIG. 15 is a schematic view illustrating a method of driving a nonvolatile memory device in accordance with an exemplary embodiment.

FIGS. 16 to 18 are sectional views of a nonvolatile memory device in accordance with other exemplary embodiments.

FIGS. 19 and 20 are sectional views of a nonvolatile memory device in accordance with still other exemplary embodiments.

FIGS. 21 to 25 are sequential sectional views illustrating a method of manufacturing a nonvolatile memory device in accordance with an exemplary embodiment.

FIG. 26 is a conceptual sectional view illustrating a method of manufacturing a nonvolatile memory device in accordance with an exemplary embodiment.

FIG. 27 is a sequential sectional view illustrating a method of manufacturing a nonvolatile memory device in accordance with still another exemplary embodiment.

FIG. 28 is a sequential sectional view illustrating a method of manufacturing a nonvolatile memory device in accordance with yet another exemplary embodiment.

FIG. 29 is a view illustrating a method of manufacturing a nonvolatile memory device in accordance with even another exemplary embodiment.

BEST MODE

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIG. 1 is a sectional view of a unit memory cell in a nonvolatile memory device in accordance with an exemplary embodiment.

Referring to FIG. 1, the nonvolatile memory device includes a first electrode 120, a second electrode 180, and a nano crystal layer 140. A material layer between the first electrode 120 and the nano crystal layer 140 and a material layer between the second electrode 180 and the nano crystal layer 140 are formed asymmetric to each other. Here, "asymmetric" refers to differences in the thicknesses of material layers at both sides of the nano crystal layer 140, whether to include an intermediate layer such as a buffer layer, and the properties, positions, or numbers of buffer layers.

More specifically, the nonvolatile memory device includes respectively spaced first and second electrodes 120 and 180, first and second conductive organic layers 130 and 160 having a bistable conductive property between the first and second electrodes 120 and 180, a nano crystal layer 140 including a nano crystal 141 and an insulation layer 142 between the first and second conductive organic layers 130 to 160, a first buffer layer 150 between the nano crystal layer 140 and the second conductive organic layer 160, and a second buffer layer 170 between the second conductive organic layer 160 and the second electrode 180.

A substrate 100 may be an insulation substrate, a semiconductor substrate, or a conductive substrate. That is, the substrate 100 may be at least one of an $Al_2O_3$ substrate, a SiC substrate, a ZnO substrate, a Si substrate, a GaAs substrate, a GaP substrate, a $LiAl_2O_3$ substrate, a BN substrate, an MN substrate, a SOI substrate, and a GaN substrate. Here, if the substrate 100 includes a semiconductor substrate and a conductive substrate, an insulator needs to be formed between the first electrode 120 and the substrate 110 in order for insulation. Additionally, the substrate 110 may be a solid substrate or a flexible substrate. The flexible substrate includes a plastic substrate of PE, PES, PET, or PEN.

The first and second electrodes 120 and 180 may use all materials having electrical conductivity, but may use materials having a low electrical resistance and an excellent interfacial property to organic material. Metals such as Al, Ti, Zn, Fe, Ni, Sn, Pb, Cu, and an alloy thereof may be used for the first and second electrodes 120 and 180. Moreover, the respectively spaced first electrodes 120 extend in one direction and the respectively spaced second electrodes 180 extend in another direction perpendicular to the first electrodes 120. A material layer is stacked between the intersection points of the first and second electrodes 120 and 180 extending in respectively perpendicular directions in order to constitute a basic memory cell.

The first and second conductive organic layers 130 and 160 may use low molecular weight materials having a charge transfer property, and for example, may be formed of at least one of $Alq_3$, AIDCN, α-NPD, PtOEP, TPD, ZnPc, CuPc, C60, PBD, CBP, Pentacene, Balq, and PCBM. Additionally, the first and second conductive organic layers 130 and 160 may be formed of high molecular weight materials such as PVK and Ps. The first and second conductive organic layers 130 and 160 have a bistable property, i.e. two kinds of conductivities of a high resistance state and a low resistance state at the same voltage.

Each of the first and second conductive organic layers 130 and 160 may be formed with a thickness of approximately 20 nm to approximately 70 nm, and may have the same thickness or different thicknesses. For example, the second conductive organic layer 160 may be formed thicker than the first conductive organic layer 130. This forms a memory to be asymmetric in order to improve a rectifying operation, and prevents a memory device from being damaged when an overcurrent flows in the memory due to the inflow of a large amount of charges as forward bias is applied.

The charges of the nano crystal layer 140 are charged or discharged when bias is applied, and accordingly, the memory device maintains a low resistance state or a high resistance state. That is, according to a state of the nano crystal layer 40, the memory device maintains a program or erase state. The nano crystal layer 140 includes a nano crystal 141 of crystalline material and an insulation layer 142 (i.e. a tunneling barrier).

The nano crystal 141 may be formed using one of Al, Mg, Zn, Ni, Fe, Cu, Au, Ag, and an alloy thereof. The insulation layer 142 may be formed to surround the nano crystal 141, and may include an insulator such as an oxide or a dispersion stabilizer. For example, the nano crystal 141 may be formed of Ni and the insulation layer 142 may be formed of NiO. This nano crystal layer 140 may be formed by depositing and oxidizing a metal in an evaporation deposition chamber.

For example, a metallic material is deposited on the first conductive organic layer 130 in an evaporation deposition chamber, and then, an oxidation process using O2 plasma is performed therein in order to form the nano crystal layer 140. However, the present invention is not limited thereto, and therefore, the nano crystal layer 140 may be formed in an evaporation deposition chamber through the oxidation of a metal. However, in order to form the stable nano crystal 141 having a predetermined size, a compulsory oxidation process may be used through an O2 plasma process along the grain boundary. The nano crystal layer 140 including the nano crystal 141 and the insulation layer 142 surrounding it are formed through such a metal deposition process and an oxidation process. Due to the insulation layer 142, the depth of a quantum well is increased. Thus, the data retention of the memory device may be improved.

Moreover, the nano crystal layer 140 may be formed of a single layer or a multi layer. The thickness of the nano crystal layer 140 having a single layer may be approximately 1 nm to approximately 40 nm. One to ten of the nano crystal layer 140 having a single layer may be stacked. With the nano crystal layer 140 in the above range, an effective energy gap for improving the data retention of a device may be maintained. Also, the thickness of the nano crystal layer 140 at each stacked layer may be uniformly formed.

The first and second buffer layers 150 and 170 are formed on and below the second conductive organic layer 160, respectively. That is, the first buffer layer is formed between the nano crystal layer 140 and the second conductive organic layer 160, and the second buffer layer 170 is formed between the second conductive organic layer 160 and the second electrode 180. At least one of the first and the second buffer layers 150 and 170 may be formed of a metal compound having a low work function metal. For example, the metal compound may include alkali metal or alkali earth metal. More specifically, the metal compound may be formed of at least one of Lithium fluoride (LiF), NaCl, CsF, $Li_2O$, BaO, and Lithium quinolate (Liq). With the formed first or second buffer layer 150 or 170, the interfacial property to the first electrode 120 or the nano crystal layer 140 may be improved.

According to an embodiment of the present invention, the first and second buffer layers are formed of the same material, but the present invention is not limited thereto. That is, the first and second buffer may be formed of different materials.

Each of the first and second conductive organic layers 150 and 170 may be formed with a thickness of approximately 0.1 nm to approximately 1 nm, and may have the same thickness or a different thickness. For example, the second buffer layer 170 may be formed thicker than the first buffer layer 150. Such the first and second buffer layers 150 and 170 facilitate charge injection and transfer from the second electrode 180 to the nano crystal layer 140 when forward bias is applied, i.e. a high voltage is applied to the first electrode 120 and a low voltage is applied to the second electrode 180. Such the first and second buffer layers 150 and 170 serve as a barrier to block charge transfer to the second electrode 180 when reverse bias is applied, i.e. a low voltage is applied to the first electrode 120 and a high voltage is applied to the second electrode 180. When the first and second buffer layers 150 and 170, which facilitate charge transfer in forward bias and serve as a barrier in reverse bias, are prepared, the memory device has a rectifying function as a cell itself without an additional device such as a diode.

Although the nonvolatile memory device including the first and second buffer layers 150 and 170 is described above, the present invention is not limited thereto. Thus, a nonvolatile memory device including at least one of the first and second buffer layers 150 and 170 may be manufactured.

FIGS. 2 and 3 are sectional views of a nonvolatile memory device including a buffer layer in accordance with other exemplary embodiments.

Referring to FIG. 2, the nonvolatile memory device includes respectively spaced first and second electrodes 120 and 180 disposed on a substrate 110, first and second conductive organic layers 130 and 160 having a bistable conductive property between the first and second electrodes 120 and 180, a nano crystal layer 140 having the oxidized surface and uniformly distributed between the first and second conductive organic layers 130 to 160, and a buffer layer 150 between the nano crystal layer 140 and the second conductive organic layer 160.

Referring to FIG. 3, the nonvolatile memory device includes respectively spaced first and second electrodes 120 and 180 disposed on a substrate 110, first and second conductive organic layers 130 and 160 having a bistable conductive property between the first and second electrodes 120 and 180, a nano crystal layer 140 including a nano crystal 141 having the oxidized surface and uniformly distributed between the first and second conductive organic layers 130 to 160, and a buffer layer 170 between the second conductive organic layer 160 and the second electrode 180. The nonvolatile memory device includes the nano crystal layer 140 between the first and second electrodes 120 and 180. Also, a material layer between the first electrode 120 and the nano crystal layer 140 and a material layer between the nano crystal layer 140 and the second electrode 180 are prepared asymmetric to each other. That is, the first conductive organic layer 130 is prepared between the first electrode 120 and the nano crystal layer 140, and the second conductive organic layer 160 and at least one of the buffer layers 150 and 170 are prepared between the nano crystal layer 140 and the second electrode 180. The buffer layers 150 and 170 facilitate charge injection and transfer to the nano crystal layer 140 in forward bias and serve as a barrier to suppress charge transfer in reverse bias. Once the buffer layers 150 and 170 are prepared to allow the memory device to perform a selection function, the memory device may provide a memory cell having a selection function without an additional selection device such as a diode.

Hereinafter, characteristics according to various modifications of the nonvolatile memory device will be described.

(Experiment 1) Nonvolatile Organic Memory Device Including First and Second Buffer Layers An 80 nm first electrode (Al), a 35 nm first conductive organic layer ($Alq_3$), a 20 nm nano crystal (Ni), a 0.2 nm first buffer layer (LiF), a 45 nm second conductive organic layer ($Alq_3$), a 0.6 nm second buffer layer (LiF), and an 80 nm second electrode (Al) are stacked on a silicon substrate in order to manufacture a nonvolatile memory device. Here, a nano crystal layer is formed through oxygen plasma treatment of Ni for approximately 300 sec.

FIG. 4 is a current-voltage (I-V) characteristic graph of the nonvolatile memory device in accordance with the experiment 1. FIG. 5 is a retention characteristic graph of the nonvolatile memory device in accordance with the experiment 1. FIG. 6 is an endurance characteristic graph according to the number of programs and erases of the memory device in accordance with the experiment 1.

Referring to FIG. 4, when the first electrode and the second electrode are respectively connected to an anode and a cathode in order to apply forward bias and increase its size sequentially, the memory device has a high resistance state, i.e. an off state Ioff (in which a current is exponentially and slowly increased until a first level voltage, i.e. a threshold voltage Vth). Then, when a voltage more than a threshold voltage Vth is applied, a current is drastically increased. Until a second level voltage Vp, as a voltage is increased, a current is increased. However, a Negative Differential Resistance (NDR) region, where a current is decreased, appears after the second level voltage Vp. Then, when a voltage more than a third voltage Ve is applied after the NDR region is passed, as a voltage is increased, a current is increased. For example, when the first electrode is connected to an anode and the second electrode is connected to a cathode in order to sequentially increase forward bias to approximately 8 V and apply it, the amount of a current is increased at a threshold voltage Vth of approximately 2.1 V. Also, from a threshold voltage Vth to a voltage Vp of approximately 3.4 V, as a voltage is increased, a current is continuously increased and reaches the maximum value. Thereafter, until a voltage Ve of approximately 5V, as a voltage is increased, a current is decreased, i.e., the NDR region appears. Then, after a voltage Ve of approximately 5 V, as a voltage is increased, a current is increased.

Through such a phenomenon, a voltage range of program, erase, and read operations may be set for the nonvolatile memory device. For example, a read operation is performed at a voltage below a threshold voltage Vth, a program operation is performed at a voltage between a threshold voltage Vth and a voltage Ve of the NDR region, and an erase operation is performed at a voltage over a voltage Ve of the NDR region. Accordingly, the nonvolatile memory device performs a read operation at a voltage below approximately 2.1 V, performs a program operation a voltage between approximately 2.1 V to approximately 5 V, (may be at approximately 3.4 V), and performs an erase operation at a voltage over approximately 5 V. Moreover, the memory device may be programmed by applying a voltage of the NDR region between the second level voltage Vp and the third level voltage Ve. In this case, a current, which is lower than an on-current Ion of a memory cell programmed with the second level voltage Vp and is higher than an off-current Ioff, flows through the memory device programmed with a voltage of the NDR region. Accordingly, a multi level program becomes possible.

Additionally, referring to FIG. 4, after the program voltage Vp is applied to the nonvolatile memory device in order to program it and then forward bias is increased again to approximately 8 V and applied, since charges are charged in the nano crystal layer, the memory device has a low resistance state, i.e. a state of an on-current Ion, in which a current is increased more than before. However, a ratio of an on-current Ion and an off-current Ioff is approximately $8.4 \times 10^2$.

Moreover, when the first electrode is connected to a cathode and the second electrode is connected to an anode in order to sequentially increase reverse bias, as a voltage is increased in a negative position, a currently is slowly increased.

In relation to such the nonvolatile memory device, when electrons are not charged in the nano crystal layer 140 due to an energy level difference between the first and second conductive organic layers 130 and 160, a current flow may be minutely increased at a predetermined voltage level, but when a voltage applied to the both ends of the conductive organic layers 130 and 160 is higher than a threshold voltage Vth, a current flow is drastically increased as electrons are charged in the nano crystal 141. Accordingly, the nonvolatile memory device maintains a high resistance state and a low resistance state. Moreover, when electrons are charged in the nano crystal layer 140, a current flow becomes greater by several ten times to several ten thousand times, compared to the case that electrons are not charged. Since the first and second buffer layers 150 and 170 are prepared, electron injection is facilitated over a threshold voltage Vth while forward bias is applied, so that a program voltage is reduced. Also, a drastic current increase may be prevented by restricting electron transfer while reverse bias is applied.

FIG. 5 is a data retention characteristic graph of the nonvolatile memory device in accordance with the experiment 1. A change A according to the time of an on-current Ion when a 1 V read voltage is applied after approximately 3 V is applied for program is compared with a change B according to the time of an off-current Ioff when a 1 V read voltage is applied after approximately 10 V is applied for erase. As shown in FIG. 5, it is observed that there is a large current difference between an on-current Ion and an off-current Ioff. At this point, an on/off-current ratio Ion/Ioff is approximately $2.7 \times 10^2$.

Additionally, FIG. 6 is an endurance cycle graph according to the number of programs and erases of the nonvolatile memory device in accordance with the experiment 1. it is observed that there is a great difference between a change A according to the number of programs when a 1 V read voltage is applied after approximately 3 V is applied for program and a change B according to the number of erases when a 1 V read voltage is applied after approximately 10 V is applied for erase. At this point, an on/off-current ratio Ion/Ioff is approximately $0.33 \times 10^2$.

As can be observed from such a result, the nonvolatile memory device in accordance with an exemplary embodiment, where the first conductive organic layer, the nano crystal layer, the first buffer layer, the second conductive organic layer, and the second buffer layer are stacked between the first electrode and the second electrode, has low program, erase, and read voltages, an excellent on/off-current ratio Ion/Ioff, and excellent data retention and endurance properties. Accordingly, the present invention may implement a nonvolatile memory device having the above excellent properties.

(Experiment 2) Nonvolatile Memory Device Manufactured on Flexible Substrate

An 80 nm first electrode (Al), a 35 nm first conductive organic layer ($Alq_3$), a 20 nm nano crystal (Ni), a 0.2 nm first buffer layer (LiF), a 45 nm second conductive organic layer ($Alq_3$), a 0.6 nm second buffer layer (LiF), and an 80 nm second electrode (Al) are stacked on a PES film in order to manufacture a nonvolatile memory device.

FIG. 7 is a current-voltage (I-V) characteristic graph of the nonvolatile memory device in accordance with the experiment 2. FIG. 8 is a retention characteristic graph of the nonvolatile memory device in accordance with the experiment 2. FIG. 9 is a characteristic graph according to the number of bending.

Referring to FIG. 7, when the first electrode and the second electrode are respectively connected to an anode and a cathode in order to apply forward bias and increase its size sequentially, the memory device has a high resistance state, i.e. an off state Ioff (in which a current is exponentially and slowly increased until a threshold voltage Vth of approximately 2.9 V). Then, when a voltage more than a threshold voltage Vth of approximately 2.9 V is applied, as a voltage is increased, a current is increased until approximately 4.0 V. Thereafter, an NDR region, where a current is decreased, appears. Then, when the voltage becomes more than a voltage Ve of approximately 6.2 V after the NDR region is passed, as a voltage is increased, a current is increased again. Accordingly, a voltage below approximately 2.9 V is used as a read voltage, approximately 2.9 V to approximately 6.2 V, which may be approximately 4.0 V, is used as a program voltage, and a voltage over approximately 6.2 V is used as an erase voltage. When a voltage is applied to a memory device programmed by applying an operating voltage, for example, approximately 4.0 V, a current is drastically increased and then becomes in a state of an on-current Ion. The on/off-current ratio Ion/Ioff of the memory device is approximately $0.38 \times 10^2$, which is less than that of the nonvolatile memory device formed on the silicon substrate of FIG. 4. However, since its operating voltage is not greatly increased, the memory device operates as an excellent one. Moreover, when reverse bias is sequentially increased and applied, a current is drastically increased at the initial state. However, as a voltage is increased in a positive direction, a current is slowly increased.

Additionally, as shown in FIG. 8, there is a great current difference between a change A of an on-current Ion according to a time when a 1 V read voltage is applied after approximately 4V is applied for program and a change B of an off-current Ioff according to a time when a 1 V read voltage is applied after approximately 8V is applied for erase. At this point, an on/off-current ratio Ion/Ioff is approximately $0.5 \times 10^2$.

FIG. 9 is a characteristic graph according to the number of bending. In order to measure a bending characteristic, a flexible device having the 40 nm width is bended in order to have an interval of approximately 25 mm between one side and the other side thereof, and then, an on-current Ion and an off-current Ioff are measured according to the number of bending.

As shown in FIG. 9, when a change A of an on-current Ion according to the number of bending when a 1 V read voltage is applied after approximately 4V is applied for program is compared with a change B of an off-current Ioff according to the number of bending when a 1 V read voltage is applied after approximately 8V is applied for erase, even if the number of bending is increased, an on-current Ion and an off-current Ioff maintain a great difference. At this point, an on/off-current ratio Ion/Ioff shows an excellent property with approximately $1.1 \times 10^2$.

(Experiment 3) Nonvolatile Memory Device Including Only First Buffer Layer

An 80 nm first electrode (Al), a 35 nm first conductive organic layer ($Alq_3$), a 20 nm nano crystal (Ni), a 0.2 nm first buffer layer (LiF), a 45 nm second conductive organic layer ($Alq_3$), and an 80 nm second electrode (Al) are stacked on a silicon substrate in order to manufacture a nonvolatile memory device. Here, a nano crystal layer is formed through oxygen plasma treatment of Ni for approximately 300 sec. That is, except that the second buffer layer is not formed, the experiment 1 and the experiment 2 are the same.

FIG. 10 is a current-voltage characteristic graph of the nonvolatile memory device in accordance with the experiment 3. That is, FIG. 10 shows a current-voltage characteristic graph of a memory device including a first buffer layer between a nano crystal layer and a second conductive organic layer.

Referring to FIG. 10, when the first electrode and the second electrode are respectively connected to an anode and a cathode in order to apply forward bias and increase its size sequentially, the memory device has a high resistance state, i.e. an off state Ioff (in which a current is exponentially and slowly increased until a threshold voltage Vth of approximately 2.1 V). Then, when a voltage more than a threshold voltage Vth of approximately 2.1V is applied, a current is drastically increased. Until approximately 3.6V, as a voltage is increased, a current is increased. Thereafter, an NDR region, where current is decreased, appears. Then, when a voltage becomes more than a voltage Ve of approximately 5.4V after the NDR region is passed, as a voltage is increased, a current is increased again. Additionally, when a voltage is applied to a memory device programmed by applying approximately 3.9 V, the memory device has a state of an on-current Ion, in which a current is drastically increased. Additionally, when reverse bias is sequentially increased, a current is somewhat greatly increased at a predetermined voltage, but is smoothly increased on the whole.

(Experiment 4) Nonvolatile Memory Device Including Only Second Buffer Layer

An 80 nm first electrode (Al), a 35 nm first conductive organic layer ($Alq_3$), a 20 nm nano crystal (Ni), a 45 nm second conductive organic layer ($Alq_3$), a 0.6 nm second buffer layer (LiF), and an 80 nm second electrode (Al) are stacked on a silicon substrate in order to manufacture a nonvolatile memory device.

FIG. 11 is a current-voltage characteristic graph of the nonvolatile memory device in accordance with the experiment 4. That is, FIG. 10 shows a current-voltage characteristic graph of a memory device including a second buffer layer between a second conductive organic layer and a second electrode. That is, referring to FIG. 11, when forward bias is applied and a voltage is sequentially increased, the memory device has a high resistance state, i.e. an off state Ioff (in which a current is exponentially and slowly increased until a threshold voltage Vth of approximately 2.1 V). Then, when a voltage more than a threshold voltage Vth of approximately 2.1V is applied, a current is drastically increased. Until approximately 3.5V, as a voltage is increased, a current is increased. Thereafter, an NDR region, where a current is decreased, appears. Then, when the voltage becomes more than a voltage Ve of approximately 7.1V after the NDR region is passed, as a voltage is increased, a current is increased again. Additionally, when a voltage is applied to a memory device programmed by applying approximately 3.5V, the memory device has a state of an on-current Ion, in which a current is drastically increased. Additionally, when reverse bias is sequentially increased, a current is smoothly increased.

(Experiment 5) Organic Memory Device Including First and Second Buffer Layers Having the Same Thickness An 80 nm first electrode (Al), a 35 nm first conductive organic layer ($Alq_3$), a 20 nm nano crystal (Ni), a 0.6 nm first buffer layer (LiF), a 45 nm second conductive organic layer ($Alq_3$), a 0.6 nm second buffer layer (LiF), and an 80 nm second electrode (Al) are stacked on a silicon substrate in order to manufacture a nonvolatile memory device.

FIG. 12 is a current-voltage characteristic graph according to a thickness change of the nonvolatile memory device in accordance with the experiment 5.

Referring to FIG. 12, when forward bias is sequentially increased, the memory device has a high resistance state, i.e. an off state Ioff (in which a current is exponentially and slowly increased until a threshold voltage Vth of approximately 2.1 V). Then, when a voltage more than a threshold voltage Vth of approximately 2.1 V is applied, a current is drastically increased. Then, an NDR region, where as a voltage is increased, a current is increased until approximately 4.0 V, and thereafter, the current is decreased, appears. Then, when a voltage becomes more than a voltage Ve of approximately 5.7 V after the NDR region is passed, as a voltage is increased, a current is increased again. Additionally, when a voltage is applied to a memory device programmed by applying approximately 4.0 V, the memory device has a state of an on-current Ion, in which a current is drastically increased. Additionally, when reverse bias is increased, a current is drastically increased. However, as the reverse bias is increased, a current is smoothly increased.

Even though the first and second buffer layers have the same thickness, it is observed that operating characteristics of the memory device do not greatly change.

(Experiment 6) Manufacturing Nonvolatile Organic Memory Device by Using Liq

An 80 nm first electrode (Al), a 35 nm first conductive organic layer ($Alq_3$), a 20 nm nano crystal (Ni), a 0.2 nm first buffer layer (LiF), a 45 nm second conductive organic layer ($Alq_3$), a 0.6 nm second buffer layer (LiF), and an 80 nm second electrode (Al) are stacked on a silicon substrate in order to manufacture a nonvolatile organic memory device.

FIG. 13 is a current-voltage characteristic graph according to a material change of the nonvolatile memory device in accordance with the experiment 6. Referring to FIG. 13, when forward bias is sequentially increased and then applied, the memory device has a high resistance state, i.e. an off state Ioff (in which a current is exponentially and slowly increased until a threshold voltage Vth of approximately 2.2 V). Then, when a voltage more than a threshold voltage Vth of approximately 1.1 V is applied, a current is drastically increased. Then, an NDR region, where as a voltage is increased, a current is increased until approximately 3.5 V and thereafter, the current is decreased, appears. Then, when a voltage becomes more than a voltage Ve of approximately 6.2 V after the NDR region is passed, as the voltage is increased, a current is increased again. Additionally, for example, when a voltage is applied to a memory device programmed by applying approximately 3.5V, the memory device has a state of an on-current Ion, in which a current is drastically increased. Moreover, after the memory device is programmed by applying approximately 4.5 V and approximately 5.5 V, i.e. voltages of the NDR region, and then, the same voltages are applied again, it has a state of intermediate currents Iint1 and Iint2, which is lower than an on-current Ion and higher than an off-current Ioff. That is, when a read operation is performed after the memory device is programmed by applying a predetermined voltage thereto, it is observed that a current higher than an off-current Ioff flows. Accordingly, a multi level program according to a program voltage becomes possible. Additionally, when reverse bias is applied, a current is greatly changed at a predetermined voltage, but is smoothly increased and flows.

FIG. 14 is a data retention characteristic graph of the nonvolatile memory device in accordance with the experiment 6. A change A according to the time of an on-current Ion when a 1 V read voltage is applied after approximately 3.5V is applied for program, a change B according to the time of an off-current Ioff when a 1 V read voltage is applied after approximately 8V is applied for erase, and changes C and D according to the time of intermediate currents Iint1 and Iint2 when a 1 V read voltage is applied after voltages of approximately 4.5 V and approximately 5.5 V are respectively applied for program are compared with each other. As shown in FIG. 14, as time elapses, it can be observed that predetermined data are maintained from a great difference between an on-current Ion, an off-current Ioff, and intermediate currents Iint1 and Iint2.

When Liq is used as a material of the first and second buffer layers, similar operating characteristics are shown.

As mentioned above, the nonvolatile memory device performs a program or erase operation by charging or discharge charges in the nano crystal layer 140 after a program voltage or an erase voltage is applied between the first electrode 110 and the second electrode 180 to have a predetermined potential difference. Also, when a read voltage is applied, the nonvolatile memory device detects a program or erase state according to charges stored in the nano crystal layer 140. A method of driving such a nonvolatile memory device will be described as follows.

FIG. 15 is a schematic view illustrating a method of driving a nonvolatile memory device in accordance with an exemplary embodiment. That is, the schematic view of FIG. 15 illustrates the program, erase, and read methods of a nonvolatile memory device.

Referring to FIG. 15, the nonvolatile memory device includes a plurality of first conductive lines 10 including 11, 12, and 13 extending in one direction and spaced a predetermined interval from each other, a plurality of second conductive lines 20 including 21, 22, and 23 extending in a perpendicular direction to the first conductive line 10 and spaced a predetermined interval from each other, and a plurality of memory cells 30 disposed at intersection points between the first and second conductive lines 10 and 20. Additionally, as mentioned above, the memory cell 30 includes a first electrode 120, a first conductive organic layer 130, a nano crystal layer 140, a second conductive organic layer 160, at least one of first and second buffer layers 150 and 170, and a second electrode 180. Here, The first and second electrodes 120 and 180 are portions of the first and second conductive lines 10 and 20. According to this embodiment, program, read, and erase operations are performed at respective potential differences of approximately 4 V, approximately 1 V, and approximately 7 V. That is, a method of driving a nonvolatile memory device will be described.

In order to select the memory cell 31 at the intersection point of the first conductive line 12 and the second conductive line 22 and program it, approximately 2 V is applied to the first conductive line 12 and approximately −2 V is applied to the second conductive line 22, which pass the memory cell 31. Additionally, approximately 2 V is applied to the first conductive lines 11 and 13 not connected to the memory cell 31, and approximately 2V is applied to the second conductive lines 21 and 23. Therefore, a 4 V potential difference in the selected memory cell 31 occurs between the first conductive line 12 and the second conductive line 22, so that the memory cell 31 is programmed, and a potential difference of approximately 0 V or approximately −4 V occurs in other memory cells. However, since the memory cell 30 includes at least one of the first and second buffer layers 150 and 180, when forward bias is applied, charge injection is facilitated, and when reverse bias is applied, charge transfer is suppressed. Accordingly, other memory cells besides the selected memory cell 10, where a reverse bias of approximately −4 V is applied, are not programmed.

Additionally, in order for a read operation of the memory cell 31, approximately 0.5V is applied to the first conductive line 12 and approximately −0.5V is applied to the second conductive line 22, which pass the memory cell 31. Additionally, approximately −0.5 V is applied to the first conductive lines 11 and 13 not connected to the memory cell 31, and approximately 0.5 V is applied to the second conductive lines 21 and 23. Therefore, a 1V potential difference in the selected memory cell 31 occurs between the first conductive line 12 and the second conductive line 22, so that a state of the memory cell 31 is read, and a potential difference of approximately 0 V or approximately −1 V occurs in other memory cells. However, since the memory cell 30 includes at least one of the first and second buffer layers 150 and 180, which facilitates charge injection when forward bias is applied and serves as a barrier for suppressing charge transfer when reverse bias is applied, besides the selected memory cell 31, other memories cells, where a reverse bias of approximately −1 V is applied, are not read.

Additionally, in order for an erase operation of the memory cell 31, approximately 3.5V is applied to the first conductive line 12 and approximately −3.5V is applied to the second conductive lines 22, which pass the memory cell 31. Additionally, approximately −3.5V is applied to the first conductive lines 11 and 13 not connected to the memory cell 31, and approximately 3.5V is applied to the second conductive lines 21 and 23. Therefore, a 7 V potential difference in the selected memory cell 31 occurs between the first conductive line 12 and the second conductive line 22, so that the memory cell 31 is erased, and a potential difference of approximately 0 V or approximately −7 V occurs in other memory cells. However, since the memory cell 30 includes at least one of the first and second buffer layers 150 and 180, which serves as an electron injection layer when forward bias is applied and serves as a barrier layer when reverse bias is applied, besides the selected memory cell 31, other memories cells, where a reverse bias of approximately −7 V is applied, are not erased.

Moreover, one embodiment of the present invention and its modifications describe a nonvolatile memory device where a first material layer between the first conductive layer electrode 110 and the nano crystal layer 140 is formed asymmetric to a second material layer between the nano crystal layer 140 and the second conductive layer electrode 180. That is, the first material layer is formed of the first conductive organic layer 130 and the second material is formed by stacking the second conductive organic layer 160 and at least one of the first and second buffer layers 150 and 170. However, as shown in FIGS. 16 to 18, the nonvolatile memory device includes the first material layer between the first conductive layer electrode 110 and the nano crystal layer 140, which is formed by stacking the first conductive organic layer 130 and at least one of the third and fourth buffer layers 152 and 172. That is, as shown in FIG. 16, the first conductive layer 120, the fourth buffer layer 172, the first conductive organic layer 130, the third buffer layer 152, the nano crystal layer 140, the second conductive organic layer 160, and the second conductive layer electrode 180 may be stacked on the substrate 110. Additionally, as shown in FIG. 17, the first conductive layer 120, the fourth buffer layer 172, the first conductive organic layer 130, the nano crystal layer 140, the second conductive organic layer 160, and the second conductive layer electrode 180 may be stacked on the substrate 110. Furthermore, as shown in FIG. 18, the first conductive layer 120, the fourth buffer layer 172, the first conductive organic layer 130, the third buffer layer 152, the nano crystal layer 140, the second conductive organic layer 160, and the second conductive layer electrode 180 may be stacked on the substrate 110. Here, the third and fourth buffer layers 152 and 172 may be formed with the same thickness, but the fourth buffer layer 172 may be formed thicker than the third buffer layer 152.

Additionally, at least one buffer layer may be formed in a first material layer, and at least one buffer layer may be formed in a second material layer. That is, as shown in FIG. 19, a first material layer may be formed including the third and fourth buffer layers 152 and 172, and a second material layer may be formed including the first and second buffer layers 150 and 170. Additionally, as shown in FIG. 20, the first material layer may be formed including the third buffer layer 152, and the second material layer may be formed including the second buffer layers 170.

As mentioned above, according to the present invention, at least one buffer layer is formed in at least one of the first material layer between the first electrode 120 and the nano crystal layer 140 and the second material layer between the nano crystal layer 140 and the second electrode 180, so that charge injection may be facilitated in forward bias and charge transfer may be suppressed in reverse bias.

Hereinafter, various methods of manufacturing a nonvolatile memory device according to the present invention will be described as follows.

FIGS. 21 to 25 are sequential sectional views illustrating a method of manufacturing a nonvolatile memory device in accordance with an exemplary embodiment. That is, the sectional views illustrate a method of manufacturing a nano crystal layer through an oxidation process.

Referring to FIG. 21, a first electrode 120 and a first conductive organic layer 130 are formed on a substrate 110. Here, the substrate 110 may be a conductive substrate, an insulation substrate, or a semiconductor substrate, and may also be a flexible substrate. Additionally, when the conductive substrate is used, an insulation layer needs to be formed thereon. At this point, the insulation layer may include an oxide layer or a nitride layer. Additionally, the first electrode 120 may use all materials having electrical conductivity, and also may use materials having a low electrical resistance and an excellent interfacial property to conductive organic materials. Metals such as Al, Ti, Zn, Fe, Ni, Sn, Pb, Cu, and an alloy thereof may be used for the first electrode 120. Then, a cleaning process is performed on the substrate 120 having the first electrode 120, and then, UV and ozone treatment is performed thereon. At this point, the cleaning process may use an organic solvent such as isopropanol (IPA) and acetone. Additionally, plasma treatment may be performed on the cleaned substrate 110 under vacuum condition. Then, the first conductive organic layer 130 is formed by evaporating an organic material at a temperature of approximately 150° C. to approximately 400° C. under a pressure inside a chamber of approximately $10^{-6}$ Pa to approximately $10^{-3}$ Pa and a deposition rate of approximately 0.2 Å/s to approximately 2 Å/s. The first conductive organic layer 130 may be formed of $Alq_3$, and may be formed with a thickness of approximately 20 nm to approximately 50 nm.

Referring to FIGS. 22 and 27, a nano crystal layer 140 is formed on the first conductive organic layer 130. At this point, in order to allow the nano crystal layer 140 to have a uniform thickness distribution of approximately 1 nm to approximately 30 nm, after a metal layer 140a is deposited on the first conductive organic layer 130, an oxidation process is performed thereon through oxygen plasma in order to form the nano crystal layer 140. For this, a metallic layer 140a having a thickness of approximately 1 nm to approximately 30 nm is formed on the first conductive organic layer 130 by evaporating a metallic material such as nickel at a temperature of approximately 800° C. to approximately 1500° C. under a pressure inside a chamber of approximately $10^{-6}$ Pa to approximately $10^{-3}$ Pa and a deposition rate of approximately 0.1 Å/s to approximately 2 Å/s.

At this point, since the metallic layer 140a has a high deposition rate, it is not formed in a nano crystal shape, and is formed as a metallic thin layer having a grain boundary as shown in FIG. 26(A).

Next, the substrate 110 having the metallic layer 140a is loaded into a chamber for oxidation. For example, the oxidation process is performed in the chamber by applying an RF power of approximately 50 W to approximately 300 W and an AC bias of approximately 100 V to approximately 200 V and injecting $O_2$ gas of approximately 100 sccm to approximately 200 sccm with a pressure of approximately 0.5 Pa to approximately 3.0 Pa. At this point, a processing time may be approximately 30 sec to approximately 500 sec.

Through this, as $O_2$ plasma penetrates and is oxidized along the boundary of the metallic layer 140a having the grain boundary as shown in FIG. 26(B), the nano crystal 141 having the same size is formed as shown in FIG. 26(C), and an insulation layer 142, i.e. an amorphous layer, is formed on the surface of the nano crystal 141. At this point, the nano crystal layer 140 may be formed with a thickness of approximately 1 nm to approximately 30 nm according to the thickness of the metallic layer 140a. Of course, even though the metallic layer 140a may be formed thick, if the metallic layer 140a is too thick (for example, more than approximately 50 nm), $O_2$ may not sufficiently penetrate the inside of the grain boundary of the metallic layer 140a, so that the nano crystal layer 140 may not be effectively formed. As shown in FIG. 26(D), after the completion of the oxidation process, the nano crystal layer 140 and the NiO insulation layer 142 surrounding it are provided.

Here, the deposition and oxidation processes of the metallic layer 140a are performed several times in order to form the multilayered nano crystal layer 140. At this point, according to a deposition thickness of the metallic layer 140a, the multilayered nono crystal layer 150 may be formed each layer having the same thickness or different thickness. It may be effective to form the nano crystal layer 140 including one to ten layers, each having the same thickness.

Referring to FIG. 23, a first layer 150 is formed on the nano crystal layer 140. The first buffer layer 150 may be formed through a vacuum thermal deposition or spin coating method, and may be formed of materials such as LiF, NaCl, CsF, $Li_2O$, BaO, and Liq. Here, the first buffer layer 150 may be formed with a thickness of approximately 0.1 nm to approximately 1 nm.

Referring to FIG. 24, a second conductive organic layer 160 is formed on the first buffer layer 150. The second conductive organic layer 160 is formed by evaporating an organic material at a temperature of approximately 150° C. to approximately 400° C. under a pressure inside a chamber of approximately $10^{-5}$ Pa to approximately $10^{-3}$ Pa and a deposition rate of approximately 0.2 Å/s to approximately 2 Å/s. The second conductive organic layer 160 may be formed of $Alq_3$, and may be formed with a thickness of approximately 20 nm to approximately 50 nm.

Referring to FIG. 25, a second buffer layer 170 is formed on the second conductive organic layer 160, and then, a second electrode 180 is formed thereon. The second buffer layer 170 may be formed through a vacuum thermal deposition or spin coating method, and may be formed of materials such as LiF, NaCl, CsF, $Li_2O$, BaO, and Liq. Here, the second buffer layer 170 may be formed with a thickness of approximately 0.1 nm to approximately 1 nm, and may be formed thicker than the first buffer layer 150. Additionally, the second electrode 180 is formed by evaporating a metallic material at a temperature of approximately 1000° C. to approximately 1500° C. under a pressure inside a chamber of approximately $10^{-6}$ Pa to approximately $10^{-3}$ Pa and a deposition rate of approximately 2/s to approximately 7/s. The second electrode 180 may be formed of Al, and may be formed with a thickness of approximately 20 nm to approximately 150 nm.

Additionally, the above-mentioned each layer may be formed in-situ under vacuum atmosphere. That is, the above-mentioned first and second electrodes 120 and 180, first and second conductive organic layers 130 and 160, the nano crystal layer 140, and first and second buffer layers 150 and 170 may be deposited in a single deposition system. For example, deposition may be performed in a single system where a chamber for depositing the first and second electrodes 120 and 180 and the metallic layer 140a for the nano crystal layer 140, a chamber for depositing the first and second conductive organic layers 130 and 160 and an organic layer for the first and second buffer layers 150 and 170, a chamber for generating plasma for oxidation, a cooling chamber, a load lock chamber, and a shadow mask chamber are connected to one transfer module. In this case, when a substrate transfers from a chamber for electrode deposition to a chamber for organic layer deposition, it may transfer using a transfer module of a vacuum state without being exposed to air. Of course, the present invention is not limited thereto, and the chambers may access different systems.

The above-mentioned nonvolatile memory device may be manufactured through a shadow mask and vacuum evaporation without an etching process. However, the present invention is not limited thereto. That is, the nonvolatile memory device may be manufactured through various methods. That is, the electrodes 120 and 280, conductive organic layers 130 and 160, nano crystal layer 140, and buffer layers 150 and 170 may be formed through an E-beam deposition process, a sputtering process, a CVD process, an MOCVD process, an MBE process, a PVD process, and an ALD process, besides a thermal evaporation process. Additionally, the electrodes 120 and 180, conductive organic layers 130 and 160, and buffer layers 150 and 170 may be formed on an entire structure, and then, their shapes may be formed through a patterning process. For example, after a conductive material is formed on the substrate 110, the first electrode 120 may be formed by removing the conductive material in an area excluding the first electrode 120 through photolithography and etching processes using a mask. Additionally, an oxidation process may be performed through wet and dry oxidation methods.

In relation to the method of manufacturing a nonvolatile memory device in accordance with the embodiment 1, the first and second conductive organic layers 130 and 160 are formed of a low molecular weight organic material such as $Alq_3$, and a metal layer is oxidized using oxygen plasma in order to form the nano crystal layer 140. However, the first and second conductive organic layers 130 and 160 may be formed of a high molecular weight material. Besides the method of forming the nano crystal layer 140 through deposition and oxidation of a metallic layer, there may be various methods such as a method of forming a nano crystal layer surrounded by an insulation layer. Hereinafter, as another embodiment, a method of manufacturing a nonvolatile memory device using a high molecular weight material for the first and second conductive organic layers 130 and 160 will be described. Moreover, in other embodiments, overlapping contents will be described briefly.

FIG. 27 is a sectional view sequentially illustrating a method of manufacturing a nonvolatile memory device in accordance with another exemplary embodiment. This embodiment describes a method of manufacturing a nonvolatile memory device where a conductive organic layer is formed using a high molecular weight material and a nano crystal layer is formed through deposition and curing processes.

Referring to FIG. 27(A), a first electrode 120 is formed on a substrate 110. Then, a first conductive organic layer 130 is formed on the first electrode 120. Here, the first conductive organic layer 130 may be formed of a high molecular weight material such as PVK or Ps, and may be formed through a spin coating method.

Referring to FIG. 27(B), a first barrier layer 192, a metallic layer 140a, a second barrier layer 194, and a second conductive organic layer 160 are sequentially formed on the first conductive organic layer 130. Here, the first and second barrier layers 192 and 194 are used to form an electron tunneling barrier surrounding a nano crystal in a nano crystal layer, which is completed through a subsequent process. The first and second barrier layers 192 and 194 may be formed of a metal oxide such as NiO, $Al_2O_3$, and $TiO_2$, and may be formed through an ALD method. Additionally, the metallic layer 140a may be formed through a deposition method, formed of all metals that can or cannot be oxidized, and formed with a thickness of approximately 1 nm to approximately 10 nm. Additionally, the second conductive organic layer 160 may be formed identical to the first conductive organic layer 130. For example, it may be formed through a spin coating method using a high molecular weight material such as PVK or Ps.

Referring to FIG. 27(C), after the second conductive organic layer 160 is formed, a curing process is performed thereon. Through the curing process, the first and second barrier layers 192 and 194 on and below the metallic layer 140 surround the metallic nano crystal layer 141 in the metallic layer 140a. Accordingly, the nano crystal layer 140 including the nano crystal 141 and the barrier 143 surrounding it is formed. The curing process may be performed for approximately 0.5 hr to approximately 4 hr at a temperature of approximately 150 and approximately 300. After the nano crystal layer 140 is formed, the second buffer layer 170 is formed on the second conductive organic layer 160, and then, the second electrode 180 is formed on the substrate 100 having the second buffer layer 170.

In relation to a method of manufacturing a nonvolatile memory device in accordance with an embodiment 2, a curing process is performed on a structure where the first insulation layer 192, the metallic layer 140a, and the second insulation layer 194 are sequentially stacked, so that the nano crystal layer 140 including the insulation layer 143, which surrounds the nano crystal layer 141, is formed, and the first and second conductive organic layers 130 and 160 are formed of a high molecular weight material. Through the above method, a nano crystal layer having uniform size and distribution may be formed. Therefore, stable device characteristics may be obtained.

FIG. 28 is a sectional view sequentially illustrating a method of manufacturing a nonvolatile memory device in accordance with another exemplary embodiment. That is, the sectional view illustrates a method of manufacturing a conductive organic layer and a nano crystal layer by depositing a nano crystal dispersed organic material.

Referring to FIG. 28(A), after a first electrode 120 is formed on a substrate 110, a conductive organic layer 135, where a plurality of nano crystals 141 are dispersed, is formed on the first electrode 120. Here, the insulation layer 144 may be formed to surround each nano crystal layer 141. A method of forming an organic material, where the nano crystal 141 surrounded by the insulation layer 144 is dispersed, will be described with reference to FIG. 25. Additionally, the conductive organic layer 135 may be formed through rotation coating and thermal treatment processes. For example, while the substrate 110 rotates at a rotational speed of approximately 1500 rpm to approximately 3000 rpm, after an organic material having the dispersed nano crystal 141 is dropped on the substrate 110, thermal treatment is performed for approximately 30 min to approximately 90 min at a temperature of approximately 100° C. to approximately 150° C. in order to form the conductive organic layer 135. Here, after the organic material is dropped, the substrate 110 rotates more for approximately 50 sec to approximately 100 sec so that the organic material is uniformly distributed.

Referring to FIG. 28(B), after the buffer layer 170 is formed on the conductive organic layer 135, the second electrode 180 is formed on the substrate 110 including the result.

In a method of manufacturing a nonvolatile memory device in accordance with an exemplary embodiment 3, the insulation layer 144 surrounding each nano crystal 141 serves as a tunneling barrier. Of course, without the insulation layer 144, the nano crystal 141 may be disposed in the conductive organic layer 135. If the insulation layer 144 is formed to surround the nano crystal 141, device reliability and endurance characteristics may be improved more compared to the case that the insulation layer 144 is not formed.

FIG. 29 is a view illustrating a method of forming the organic layer of FIG. 28(A). An organic material, where a nano crystal having a barrier layer is dispersed, will be described as an example.

First, in order to synthesize the nano crystal 141 surrounded by the barrier layer 144, operations (a) to (e) of FIG. 21 are performed.

That is, as shown in (e), an aqueous solution of a metallic salt is prepared by dissolving $HAuCl_4$ with a metallic salt in DI water of an aqueous solvent. At this point, the metallic salt in the aqueous solution is ionized into $H^+$ and $AuCl_4$, and serves as a Au source. Additionally, tetraoctylammonium (TOAB) is dissolved in toluene of a non-aqueous solvent in order to prepare a toluene solution including ionized TOAB. At this point, the ionized TOAB serves as a phase transfer catalyst for transferring $AuCl_4^-$, i.e. metal containing ions, into the toluene solution during a subsequent process.

Then, as shown in (b), when the aqueous solution of a metal salt and the toluene solution having the TOAB dissolved are agitated, $AuCl_4^-$, i.e. metal containing ions, transfers to the toluene solution. At this point, the agitation may be performed at a speed of more than approximately 500 rpm.

Carbazole terminated thiol (CB) is added to the toluene solution as a dispersion stabilizer that makes the dispersion of subsequent Au nano crystal uniform, then, the agitation is performed. At this point, the agitation may be performed for approximately 5 min to approximately 20 min at a room temperature. The molecular formula of the CB, i.e. a dispersion stabilizer, is C23H31NS, and its chemical name is 11-Carbazolyl dodecane thiol.

Then, as show in (c), sodium brohydride ($NaBH_4$) is added as a reducing agent for reducing $AuCl_4^-$ to the toluene solution having the CB added of (b), and then agitation is performed. At this point, the agitation may be performed for approximately 3 hr to approximately 10 hr at a room temperature with a speed of more than approximately 500 rpm.

As a result, as shown in (d), a combined material of the Au nano crystal and the CB is formed in the toluene solution. At this point, since the CB is formed to surround the Au nano crystal, it serves as a dispersion stabilizer and also an electron tunneling barrier like barrier materials.

Then, as shown in (e), the toluene solution is evaporated in order to leave the combined material of the Au nano crystal and the CB. This evaporation may be performed in a rotary evaporator under a relatively low pressure of less than approximately −1 Bar. Then, as shown in (f), the combined material of Au nano crystal and the CB is dissolved in chloroform. This is for mixing with a high molecular weight material. PVK as a high molecular weight material is mixed with the chloroform solution Finally, as shown in (g), a final solution, in which the Au nano crystal surrounded by the CB and the high molecular weight material are mixed, is generated. If this solution is spin-coated on a substrate, the structure of the conductive organic layer 135 shown in FIG. 28(A) is formed. In this embodiment, the nano crystal 141 dispersed in the conductive organic layer 135 is formed of Au, and the insulation layer 144 surrounding the nano crystal 141 is formed of CB.

Through the method in accordance with the embodiment 3, nano crystals having uniform size and distribution may be formed. Especially, in that an organic layer including the nano crystals is formed at once, manufacturing processes are simple and mass-production becomes possible.

Although a nonvolatile memory device has been described with reference to the specific embodiments, it is not limited thereto. Therefore, it will be readily understood by those skilled in the art that various modifications and changes can be made thereto without departing from the spirit and scope of the present invention defined by the appended claims.

The invention claimed is:

1. A nonvolatile memory device comprising:
   first and second electrodes spaced from each other;
   at least one nano crystal layer disposed between the first and second electrodes; and
   first and second material layers respectively disposed between the first electrode and the nano crystal layer and between the second electrode and the nano crystal layer,
   wherein the first and second material layers are formed with different thicknesses,
   wherein the first material layer is composed of a first conductive organic layer with one side being in contact with the first electrode and the other side being in contact with the nano crystal layer,
   wherein the second material layer is composed of a second conductive organic layer, a first buffer layer with one side being in contact with the nano crystal layer and the other side being in contact with the second conductive organic layer, and a second buffer layer with one side being in contact with the second conductive organic layer and the other side being in contact with the second electrode, and
   wherein the first buffer layer has a thickness of 0.2 nm and the second buffer layer has a thickness of 0.6 nm.

2. The nonvolatile memory device of claim 1, wherein the first and the second conductive organic layers have different thicknesses.

3. The nonvolatile memory device of claim 2, wherein the first and the second conductive organic layers are formed of at least one of $Alq_3$, AIDCN, $\alpha$-NPD, PtOEP, TPD, ZnPc, CuPc, C60, PBD, CBP, Pentacene, Balq, and PCBM.

4. The nonvolatile memory device of claim 1, wherein the first buffer layer or the second buffer layer comprises a metallic compound of an alkali metal or an alkaline earth metal.

5. The nonvolatile memory device of claim 4, wherein the first buffer layer or the second buffer layer is formed of at least one of LiF, NaCl, CsF, $Li_2O$, BaO, and Liq.

6. The nonvolatile memory device of claim 1, wherein the first and second buffer layers facilitates charge transfer in forward bias when a high voltage and a low voltage are respectively applied to the first and second electrodes and suppresses charge transfer in a reverse bias when a low voltage and a high voltage are respectively applied to the first and second electrodes.

7. The nonvolatile memory device of claim 1, further comprising a threshold voltage region where the amount of a current is drastically increased according to a potential difference applied between the first electrode and the second electrode and a negative differential resistance region where a current is decreased as a potential difference applied between the first and second electrodes is increased.

8. The nonvolatile memory device of claim 7, wherein
   a read operation is performed at a first voltage level of less than a threshold voltage;
   a program operation is performed at a second voltage level of the threshold voltage to the negative differential resistance region; and
   an erase operation is performed at a third voltage level greater than the second voltage level.

9. The nonvolatile memory device of claim 8, wherein the nonvolatile memory device is programmed to output a current with a multi-level according to the second voltage level.

10. A nonvolatile memory device comprises:
    a first electrode;
    a first conductive organic layer formed on and contacting the first electrode;
    a nano crystal layer formed on and contacting the first conductive organic layer;
    a first buffer layer formed on and contacting the nano crystal layer;
    a second conductive organic layer formed on and contacting the first buffer layer;
    a second buffer layer formed on and contacting the second conductive organic layer; and
    a second electrode formed on and contacting the second buffer layer;
    wherein the first buffer layer has a thickness of 0.2 nm and the second buffer layer has a thickness of 0.6 nm; and
    wherein the first and the second buffer layers facilitate charge transfer in a forward bias when a high voltage and a low voltage are respectively applied to the first and the second electrodes and suppresses charge transfer in a reverse bias when a low voltage and a high voltage are respectively applied to the first and the second electrodes.

11. The nonvolatile memory device of claim 10, wherein the first and second conductive organic layers are formed of at least one of $Alq_3$, AIDCN, $\alpha$-NPD, PtOEP, TPD, ZnPc, CuPc, C60, PBD, CBP, Pentacene, Balq, and PCBM.

12. The nonvolatile memory device of claim 10, wherein the second conductive organic layer is thicker than the first conductive organic layer.

13. The nonvolatile memory device of claim 10, wherein the first and the second buffer layers comprise a metallic compound of an alkali metal or an alkaline earth metal.

14. The nonvolatile memory device of claim 10, wherein the first and the second buffer layers comprise at least one of LiF, NaCl, CsF, $Li_2O$, BaO, and Liq.

* * * * *